United States Patent
Lung

(10) Patent No.: US 7,933,139 B2
(45) Date of Patent: Apr. 26, 2011

(54) ONE-TRANSISTOR, ONE-RESISTOR, ONE-CAPACITOR PHASE CHANGE MEMORY

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 54 days.

(21) Appl. No.: 12/466,970

(22) Filed: May 15, 2009

(65) Prior Publication Data

US 2010/0290271 A1    Nov. 18, 2010

(51) Int. Cl.
*G11C 11/00* (2006.01)
(52) U.S. Cl. .......................................... 365/148; 365/149
(58) Field of Classification Search .................. 365/148, 365/149
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |

(Continued)

OTHER PUBLICATIONS

"Magnetic Bit Boost," www.sciencenews.org, Dec. 18 & 25, 2004, p. 389, vol. 166.

(Continued)

*Primary Examiner* — Hoai V Ho
(74) *Attorney, Agent, or Firm* — Haynes Beffel & Wolfeld LLP

(57) ABSTRACT

Memory devices and methods for operating such devices are described herein. A memory cell as described herein comprises a transistor electrically coupled to first and second access lines. A programmable resistance memory element is arranged along a current path between the first and second access lines. A capacitor is electrically coupled to the current path between the first and second access lines.

23 Claims, 20 Drawing Sheets

U.S. PATENT DOCUMENTS

| | | |
|---|---|---|
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,404,673 B1 * | 6/2002 | Matsui .................. 365/173 |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,661,042 B2 | 12/2003 | Hsu |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,208,799 B2 | 4/2007 | Shino |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |

| | | |
|---|---|---|
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0041761 A1* | 3/2004 | Sugita et al. ............... 345/87 |
| 2004/0051094 A1 | 3/2004 | Ooishi |
| 2004/0100835 A1* | 5/2004 | Sugibayashi et al. ......... 365/200 |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |

| | | | |
|---|---|---|---|
| 2008/0138929 | A1 | 6/2008 | Lung |
| 2008/0138930 | A1 | 6/2008 | Lung |
| 2008/0138931 | A1 | 6/2008 | Lung |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0265234 | A1 | 10/2008 | Breitwisch et al. |
| 2008/0303014 | A1 | 12/2008 | Goux et al. |
| 2009/0001341 | A1 | 1/2009 | Breitwisch et al. |
| 2009/0014704 | A1 | 1/2009 | Chen et al. |
| 2009/0023242 | A1 | 1/2009 | Lung |
| 2009/0027950 | A1 | 1/2009 | Lam et al. |
| 2009/0042335 | A1 | 2/2009 | Lung |
| 2009/0057641 | A1 | 3/2009 | Lung |
| 2009/0098678 | A1 | 4/2009 | Lung |
| 2009/0147565 | A1* | 6/2009 | Lowrey .................. 365/163 |
| 2009/0166600 | A1 | 7/2009 | Park et al. |
| 2009/0166603 | A1 | 7/2009 | Lung |
| 2010/0020595 | A1* | 1/2010 | Parkinson et al. ........... 365/163 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Hanzawa, Satoru, et al., "A 512kB Embedded Phase Change Memory with 416kB/s Write Throughput at 100µA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Nitayama, Akihiro, et al., "Overview and Future Challenge of Floating Body Cell (FBC) Technology for Embedded Applications," IEEE 2006, 3 pages.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20 high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

_US 7,933,139 B2_

ONE-TRANSISTOR, ONE-RESISTOR, ONE-CAPACITOR PHASE CHANGE MEMORY

International Business Machines Corporation, a New York corporation, and Macronix International Corporation, Ltd, a Taiwan corporation, are parties to a Joint Research Agreement.

BACKGROUND OF THE INVENTION

1. Field of the Invention

The present invention relates to memory devices based on phase change based memory materials, including chalcogenide based materials and other programmable resistance materials, and methods for operating such devices.

2. Description of Related Art

In general, system-on-a-chip (SOC) technology is the integration of multiple subsystems of electronic system within a single integrated circuit, and may contain digital, analog, mixed-signal, and radio-frequency functions. The various types of subsystems that may be integrated within the integrated circuit include microprocessor and microcontroller cores, digital signal processors (DSPs), configurable logic units, memory blocks, timing sources, external interfaces, and power management circuits, among others. An SOC consists of both the hardware described above, as well as the software that controls the subsystems. The term "system-on-a-chip" may be used to describe complex application specific integrated circuits (ASIC), where many functions previously achieved by combining integrated circuits on a board are now provided by one single integrated circuit. This level of integration greatly reduces the size and power consumption of the system, while generally also reducing manufacturing costs.

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can readily be sensed to indicate data. These properties have generated interest in using programmable resistive material to form nonvolatile memory circuits, which can be read and written with random access.

However performance limitations such as a relatively slow set speed, a high reset current, and limited cycle endurance has restricted the use of phase change based memory circuits as high speed random access memory for the integrated circuit.

Thus, integrated circuits employing phase change based memory circuit typically also include other types of memory circuits in order to fulfill the memory performance requirements for the various functions of the integrated circuit. These different types of memory circuits are embedded at various locations in the integrated circuit, and typically include SRAM or DRAM memory circuits in order to provide high access speed memory for the integrated circuit. However, integration of different types of memory circuits for the various memory applications in an integrated circuit can be difficult and result in highly complex designs.

It is therefore desirable to provide a memory cell which can address different memory performance requirements, while also addressing the issue of design integration. It is also desirable to provide methods for operating such devices.

SUMMARY OF THE INVENTION

A memory cell described herein comprises a transistor electrically coupled to first and second access lines. A programmable resistance memory element is arranged along a current path between the first and second access lines. A capacitor is electrically coupled to the current path between the first and second access lines.

A memory cell described herein comprising a transistor, a capacitor and a programmable resistance memory element allows for both volatile and nonvolatile modes of memory operation. The capacitor provides fast program/erase speed, while the programmable resistance memory element provides data retention for nonvolatile data storage. The volatile and nonvolatile modes can provide different operational characteristics such as switching speed, cycle endurance, operational current, and data retention within the same memory cell. As a result, the same memory cell can serve as working memory or nonvolatile memory to address the different memory performance requirements demanded by various functions of an integrated circuit.

Methods for operating memory cells having a transistor, a capacitor, and a programmable resistance memory element are also described herein. The methods include operating the memory cell in a first mode to store a data value in the programmable resistance memory element, and operating the memory cell in a second mode to store a data value in the capacitor.

Methods for operating memory cells as described herein also include storing a data value in one of the programmable resistance memory element and the capacitor in dependence upon a data value stored in the other of the programmable resistance memory element and the capacitor. In embodiments, by applying a bias arrangement to the memory cell the data value stored in one of the programmable resistance memory element and the capacitor can be directly transferred to the other without performing a read operation. For example, the data value stored in the programmable resistance memory element during power off conditions of the integrated circuit can be transferred directly to the capacitor for use during operation of the integrated circuit. As another example, the data value stored in the capacitor during operation of the integrated circuit can be transferred directly to the memory element for nonvolatile data storage during power off conditions of the integrated circuit.

Embodiments of memory cells described herein have a small cross-sectional area which allows for implementation in high density memory arrays. In one embodiment, the capacitor is implemented as a trench capacitor within the substrate, which permits a relatively large capacitance per unit area of substrate. In another embodiment, a floating channel body of the transistor takes the place of a discrete capacitor and utilizes transient charge storage in the floating channel body of the transistor by using the capacitance formed between the floating channel body of the transistor and the underlying substrate.

Other aspects and advantages of the present invention can be seen on review of the drawings, the detailed description, and the claims which follow.

DETAILED DESCRIPTION

Figure 1:
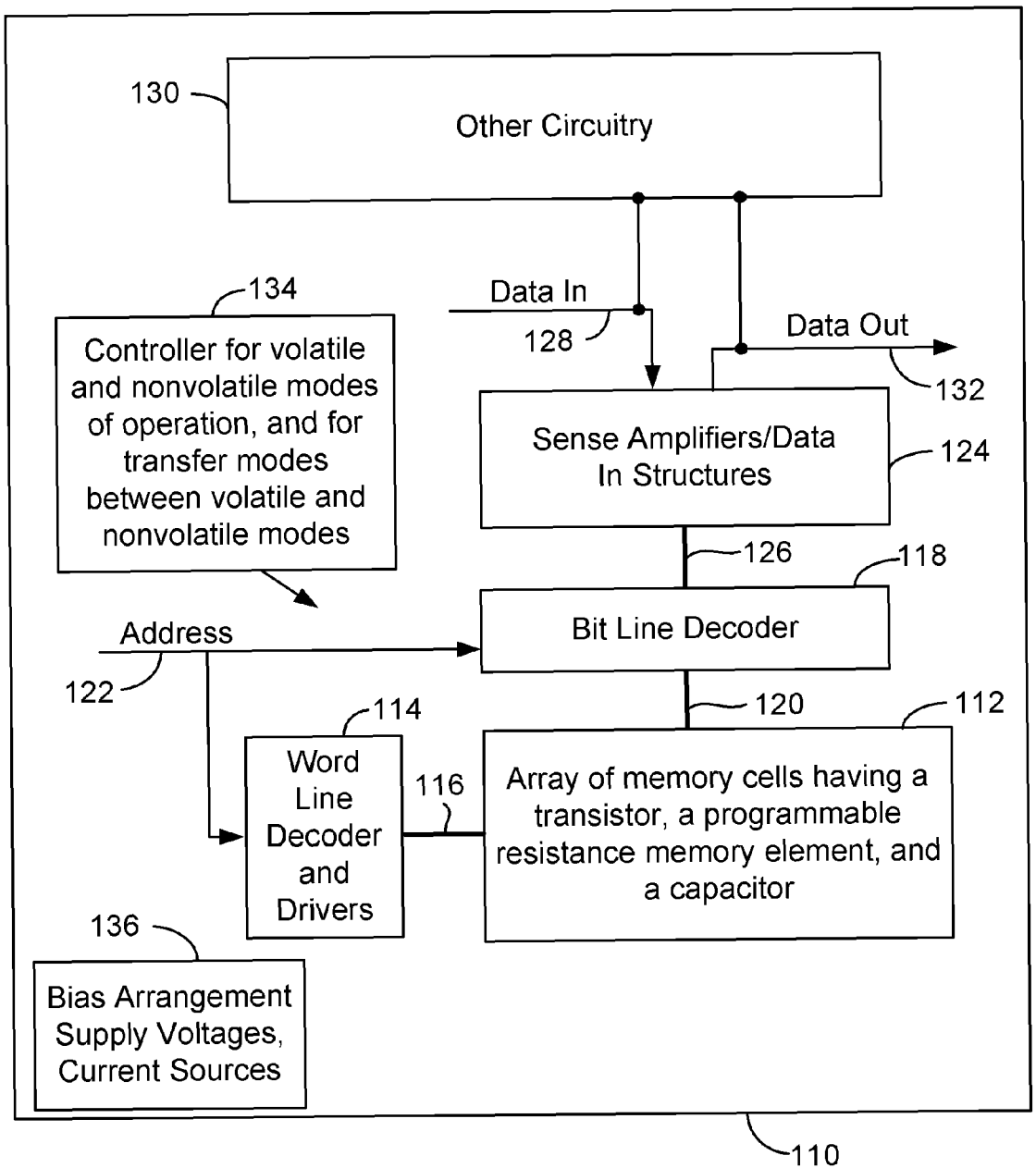
FIG. 1 is a block diagram of an integrated circuit including a memory array of memory cells each comprising a transistor, a programmable resistance memory element, and a capacitor.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram of an integrated circuit 110 including a memory array 112 of memory cells each comprising a transistor, a programmable resistance memory element, and a capacitor. As described in more detail below, the memory cells allow for both volatile and nonvolatile modes of memory operation, as well as transfer modes between the volatile and nonvolatile modes.

A word line decoder 114 is coupled to and in electrical communication with a plurality of word lines 116 arranged along rows in the memory array 112. A bit line (column) decoder 118 is in electrical communication with a plurality of bit lines 120 arranged along columns in the array 112 for operating the memory cells (not shown) in array 112. Addresses are supplied on bus 122 to word line decoder and drivers 114 and bit line decoder 118. Sense amplifiers and data-in structures in block 124, including voltage and/or current sources for volatile, nonvolatile, and transfer modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, controls the application of bias arrangement supply voltages and current sources 136, to apply bias arrangements such read, program, erase, erase verify, program verify, refresh, auto-restore, and auto-save to the memory cells of the array 112. The characteristics of the signals sent from the controller 134 to couple the bias arrangement supply voltages and current sources 136 determines the mode of operation (e.g. volatile, nonvolatile, transfer) as well as the operation (e.g. read, program, erase, auto-restore, auto-save, etc.) to be performed to the memory cells of the array 112. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134. In volatile mode, the controller 134 implements a refresh mode to periodically assess the memory cells to refresh the charge storage levels on the capacitors by either a program or erase operation, to offset any charge leakage that may occur between refresh cycles on the memory cell.

Figure 2:
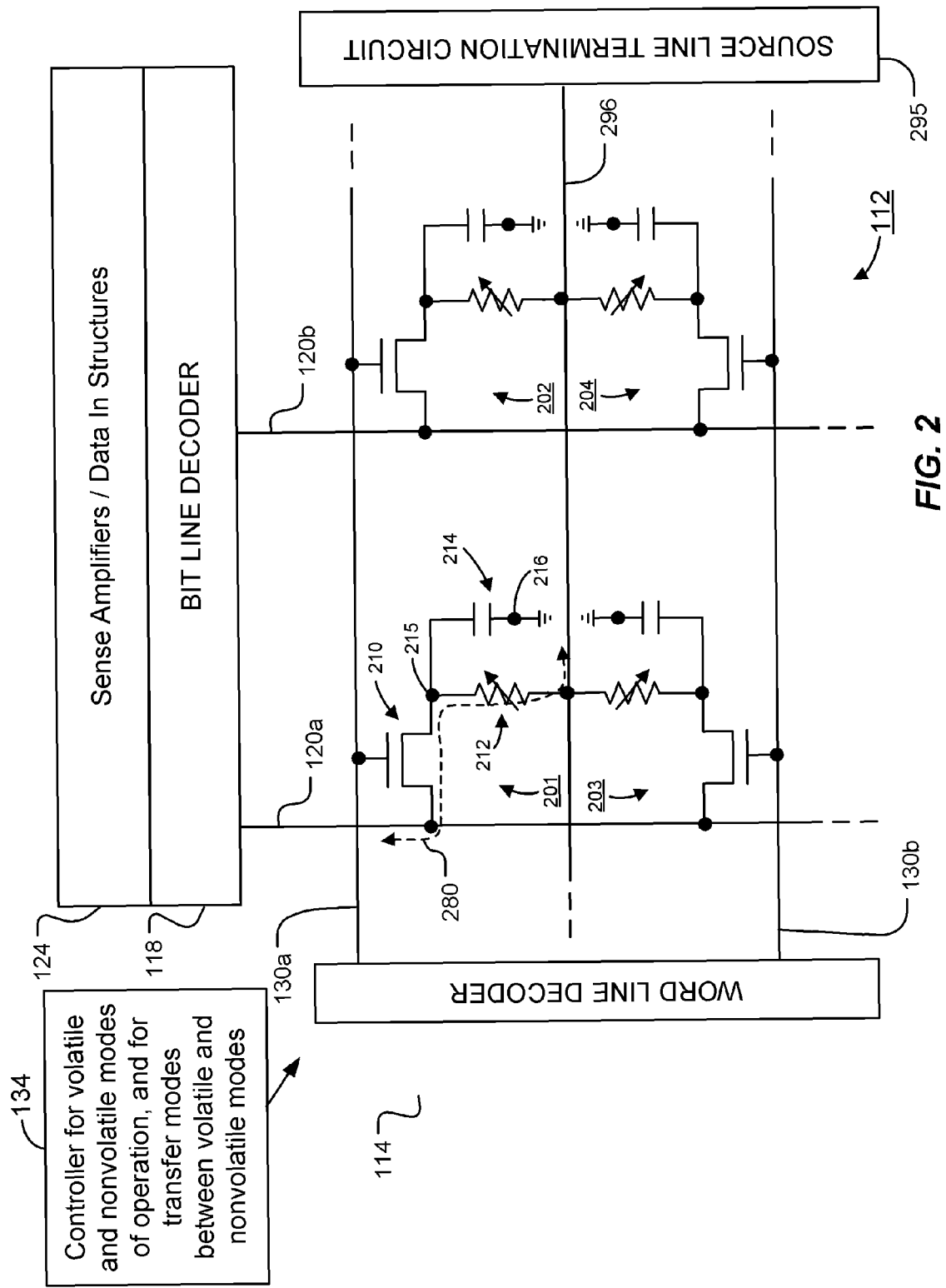
FIG. 2 illustrates a schematic diagram of a first embodiment of the array of the integrated circuit of FIG. 1.

FIG. 2 illustrates a schematic diagram of a first embodiment of array 112 of the integrated circuit 110. Each of the memory cells of the array 112 has a field effect transistor, a programmable resistance memory element (represented as a variable resistor in the Figure), and a charge storage capacitor. Four memory cells 201-204 are illustrated in FIG. 2, representing a small section of the array 112 that can include millions of memory cells. As described in more detail below, each memory cell can be operated as high-speed volatile memory using the capacitor as a data storage element, and can be operated as nonvolatile memory using the programmable resistance memory element as a data storage element. The memory cells can also be operated in a transfer mode to directly transfer a data value stored in the programmable resistance memory element to the capacitor, and vice-versa, without the need for a read operation.

In FIG. 2 the programmable resistance memory elements couple the sources of the access transistors of the memory cells 201-204 to common source line 296 that terminates in a source line termination circuit 295. In another embodiment the sources of the access transistors are not electrically connected, but independently controllable. The source line termination circuit 295 may include bias circuits such as voltage sources and current sources, and decoding circuits for applying bias arrangements to the common source line 296.

A plurality of word lines 130 including word lines 130a, 130b extend in parallel in a first direction and are in electrical communication with word line decoder/driver 114. The gate terminals of the respective access transistors are coupled to a corresponding word line 130.

A plurality of bit lines 120 including bit lines 120a, 120b extend in parallel in a second direction and are in electrical communication with bit line decoder 118. The drain terminals of the respective access transistors are coupled to a corresponding bit line 120. As used herein, the term "access line" refers generally to bit lines, source lines, or word lines.

It will be understood that the memory array 112 is not limited to the array configuration illustrated in FIG. 2, and other configurations can alternatively be used. Additionally, instead of field effect transistors, bipolar junction transistors may be used as access devices in some embodiments.

Memory cell 201 is representative of the memory cells of array 112 and comprises transistor 210, programmable resistance memory element 212, and capacitor 214. Word line 130a is coupled to the gate of the access transistor 210, bit line 120a is coupled to the drain of the access transistor 210, and the memory element 212 is arranged between the source of the access transistor 210 and the common source line 296.

The capacitor 214 has a first node 215 coupled to the source of the access transistor 210. As a result, the first node 215 is coupled to a current path between the bit line 120a and the common source line 296.

The capacitor 214 has a second node 216 coupled to ground in the illustrated embodiment. Alternatively, the second node 216 can be coupled to a voltage source of bias arrangement block 136 of FIG. 1 for applying a voltage other than ground.

As described in more detail below, the memory cell 201 operates as high speed DRAM memory or nonvolatile memory depending upon whether the capacitor 214 or the programmable resistance memory element 212 is used as a data storage element. During volatile memory operation, the memory cell 201 stores a data value as charge on the capacitor 214. During nonvolatile operation, the memory cell stores a data value as the resistance of the memory element 212.

Figure 3:
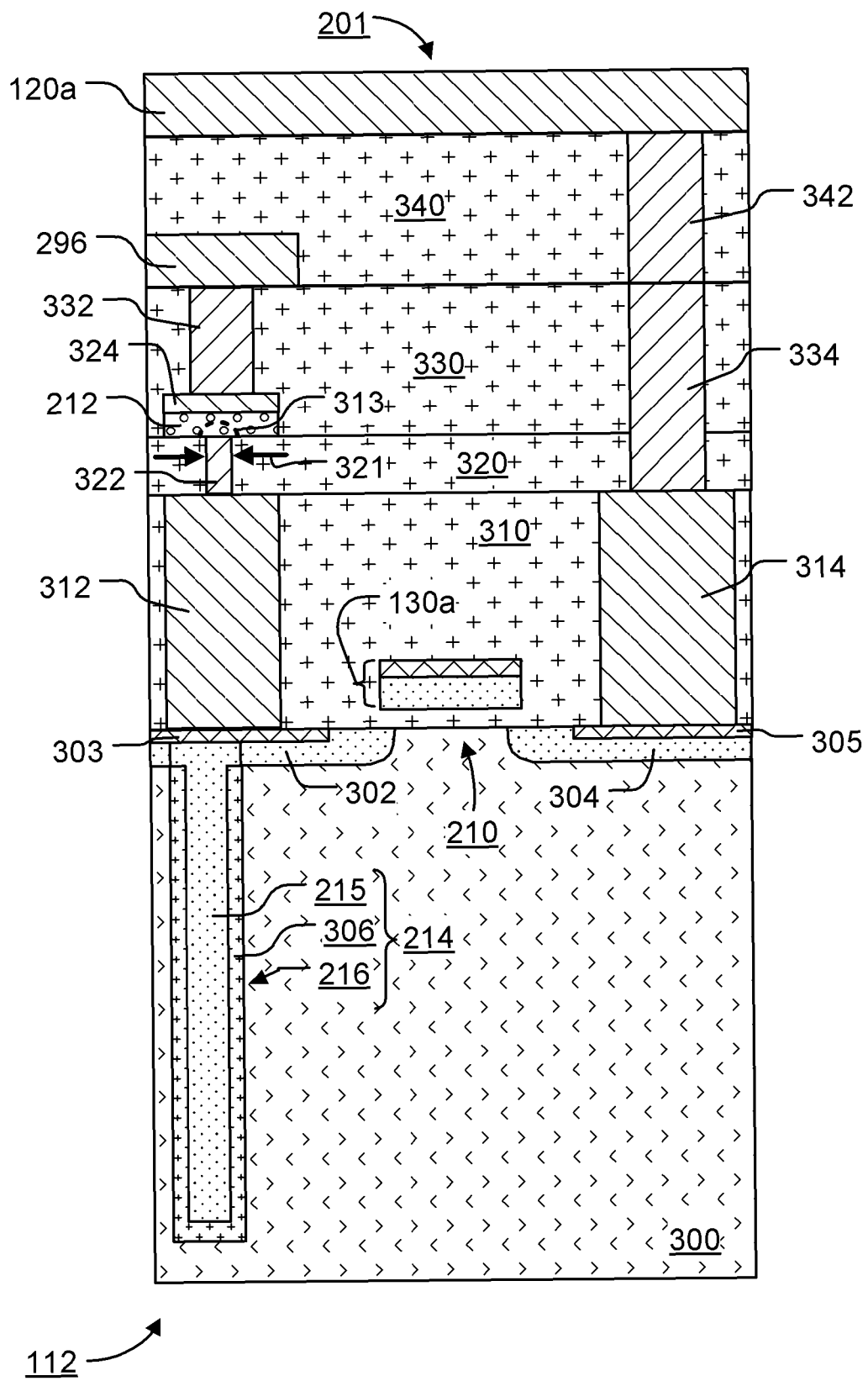
FIG. 3 illustrates a cross-sectional view of a portion of an embodiment of memory cells arranged in the array of FIG. 2.

FIG. 3 illustrates a cross-sectional view of a portion of an embodiment of memory cells (including representative memory cell 201) arranged in the array 112 of FIG. 2. The cross-section of FIG. 3 is taken along the bit lines 120.

The array 112 includes semiconductor substrate 300 having a first conductivity type. The field effect transistor 210 of the memory cell 201 includes first and second terminals 302, 304 comprising doped substrate material having a second conductivity type opposite that of the substrate 300. In the illustrated embodiment the substrate 300 comprises doped P-type material and the first and second terminals 302, 304 comprise doped N-type material, the first terminal 302 acting as the source region and the second terminal 304 acting as the drain region. The substrate 300 is coupled to a reference voltage such as ground.

Word line 130a acting as the gate of the field effect transistor 210 of the memory cell 201 extends into and out of the cross-section illustrated in FIG. 3. The word line 130a overlies the substrate 300 and comprises, for example, doped polysilicon material and a silicide layer on the doped polysilicon.

Conductive caps 303, 305 comprising silicide are on the first and second terminals 302, 304 respectively. The conductive caps 303, 305 may comprise, for example, a silicide containing Ti, W, Co, Ni, or Ta. The conductive caps 303, 305 provide low resistance contacts between the first and second terminals 302, 304 and conductive plugs 312, 314.

The conductive plugs 312, 314 extend through dielectric 310. The conductive plugs 312, 314 may comprise, for example, tungsten. Other exemplary materials that could also be used for the conductive plugs 312, 314 include, for example, Ti, Mo, Al, Ta, Cu, Pt, Ir, La, Ni, and Ru.

The memory cell 201 includes a bottom electrode 322 on the conductive plug 312. The bottom electrode 322 extends through dielectric 320 to contact a bottom surface of the programmable resistance memory element 212. The programmable resistance memory element 212 may comprise, for example, one or more materials from the group of Ge, Sb, Te, Se, In, Ti, Ga, Bi, Sn, Cu, Pd, Pb, Ag, S, Si, O, P, As, N and Au.

The memory cell 201 also includes a top electrode 324 on the programmable resistance memory element 212. The top and bottom electrodes 324, 322 may each comprise, for example, TiN or TaN. TiN may be preferred in embodiments in which the memory element 212 comprises GST (discussed in more detail below) because it makes good contact with GST, it is a common material used in semiconductor manufacturing, and it provides a good diffusion barrier at the higher temperatures at which GST transitions, typically in the 600-700° C. range. Alternatively, the top and bottom electrodes 324, 322 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

Conductive plug 332 extends through dielectric 330 to couple the top electrode 324 to the common source line 396. Dielectric 340 is on the common source line 296, and bit line 120a is on the dielectric 340. The bit line 120a is electrically coupled to the second terminal 304 by conductive plugs 342, 334, 314 and conductive cap 305. The dielectric 310, 320, 330, 340 may each comprise, for example, silicon dioxide. Alternatively other dielectric materials may be used.

During operation using the memory element 212 as the data storage element for the memory cell 201, the active region 213 is the region of the programmable resistance memory element 212 in which memory material is induced to change between at least two solid phases. As can be seen in FIG. 3, the bottom electrode 722 has a width 321 less than that of the memory element 212. In operation using the memory element 212 as the data storage element, this difference in width concentrates the current density in the portion of the memory element 212 adjacent the bottom electrode 722, resulting in the active region 313 having a "mushroom" shape as shown in FIG. 3. As a result, the configuration of the memory element 212 and the electrodes 322, 324 is commonly referred to as a mushroom-type configuration. Alternatively, the memory element 212 and the electrodes 322, 324 can be arranged in various other types of configurations. Representative alternative configurations include bridge-type, pillar-type, sidewall-type, and pore-type configuration as shown, for example, in commonly-owned and co-pending U.S. application Ser. No. 12/194,243 filed Aug. 19, 2008, which is incorporated by reference herein.

In FIG. 3 the capacitor 214 is implemented as a trench capacitor within the substrate 300, which permits a relatively large capacitance per unit area of substrate 300. Alternatively, other types of capacitors may be used.

The first node 215 of the capacitor 214 comprises doped semiconductor material deposited within a trench extending into the substrate 300, and is directly connected to the first terminal 302 of the access transistor 210. Dielectric 306 surrounds the material within the trench to separate it from the substrate 300. The portion of substrate 300 underlying and adjacent the dielectric 306 acts as the second node 216 of the capacitor 214.

During operation using the capacitor 214 as the data storage element for the memory cell 201 the source line 296 is floating, a voltage is applied to the word line 130a sufficient to turn on the access transistor 210, and an appropriate voltage is applied to the bit line 120a to add or remove charge from the first node 215 to change the voltage on the capacitor 214.

In FIG. 3 the access transistor 210 is implemented as a horizontal device having a horizontally oriented channel region between the laterally separated first and second terminals 302, 304. In some alternative embodiments the access transistor 210 can be implemented as a vertical device structure having a vertically oriented channel. Examples of vertical device structures are shown, for example, U.S. application Ser. No. 12/471,287.

Referring back to the schematic diagram of FIG. 2, operation of the memory cell 201 can be achieved by controller 134 controlling the application of bias arrangement supply voltages and current sources (See FIG. 1, reference number 136) for the application of bias arrangements including bias arrangements for volatile, nonvolatile, and transfer modes of operation of the memory cells. The bias arrangements can include voltages and/or currents applied to the word line 130a, bit line 120a, and source line 296. The level and duration of the voltages and/or currents applied is dependent upon whether the capacitor 214 or the memory element 212 is used as a data storage element, and is also dependent upon the operation performed, e.g. a reading operation or a writing operation. The levels and durations of the voltages and/or currents applied can be determined empirically for each embodiment. The various modes of operation are explained in more detail below.

Nonvolatile Operation

Figure 4A:
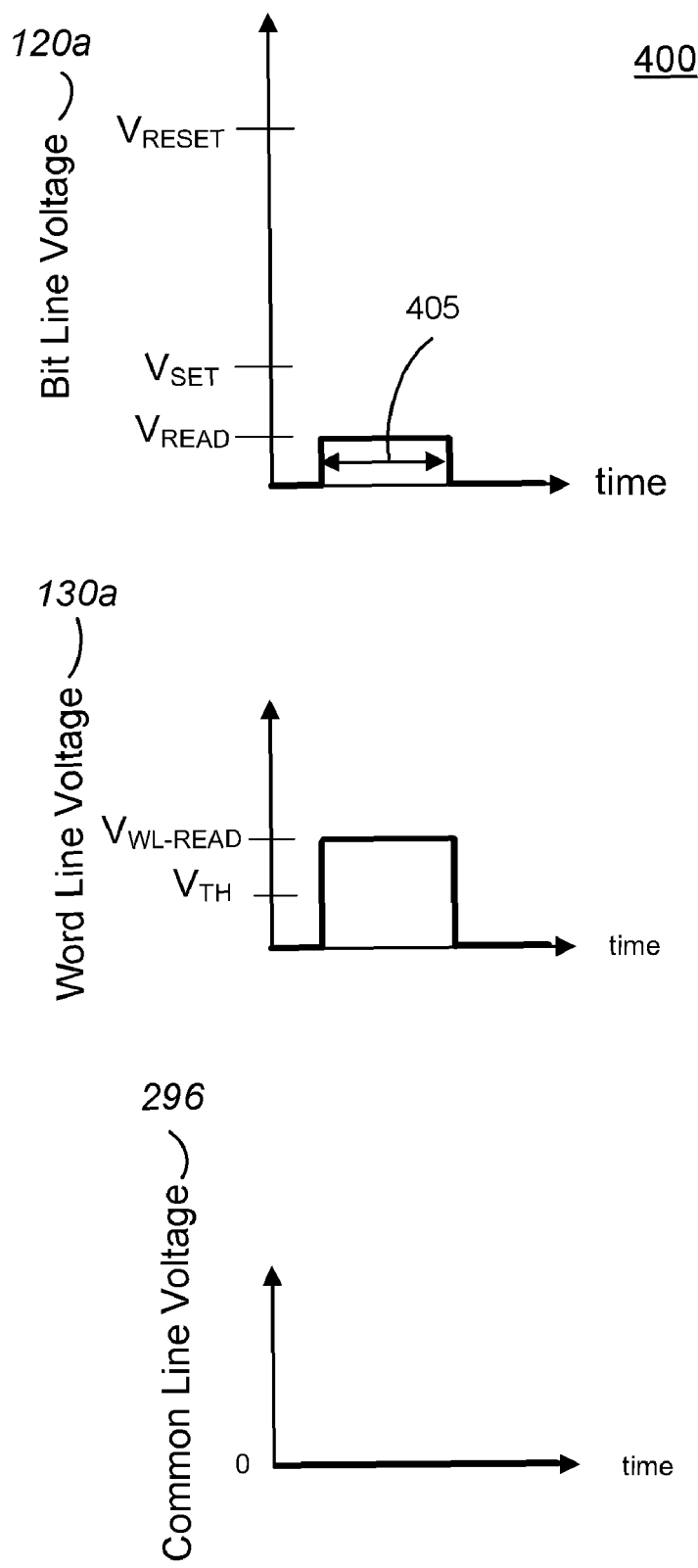
FIGS. 4A-4C are timing diagrams illustrating read, set, and reset operations of a selected memory cell using the memory element as a data storage element.
Figure 4B:
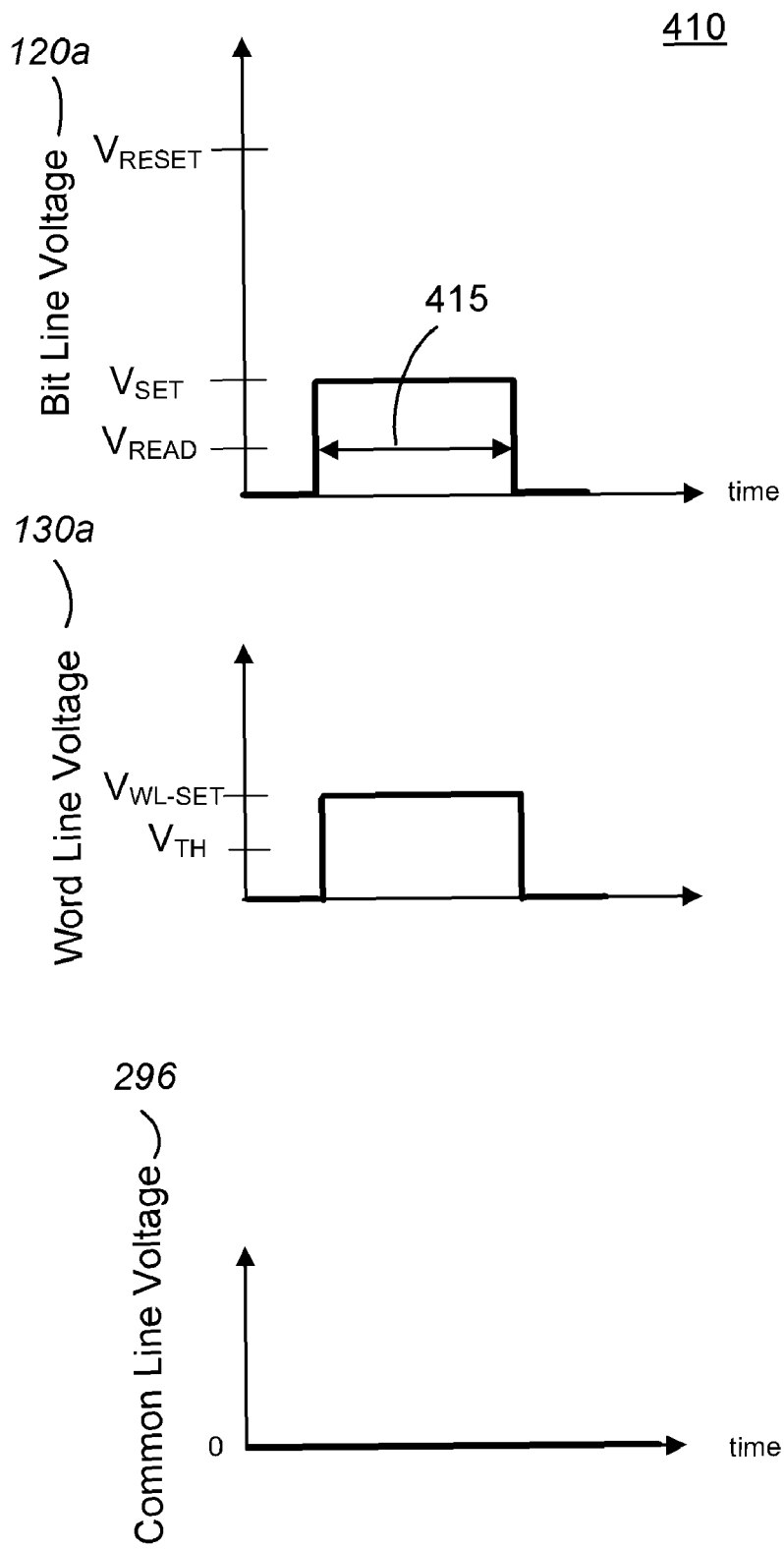
Figure 4C:
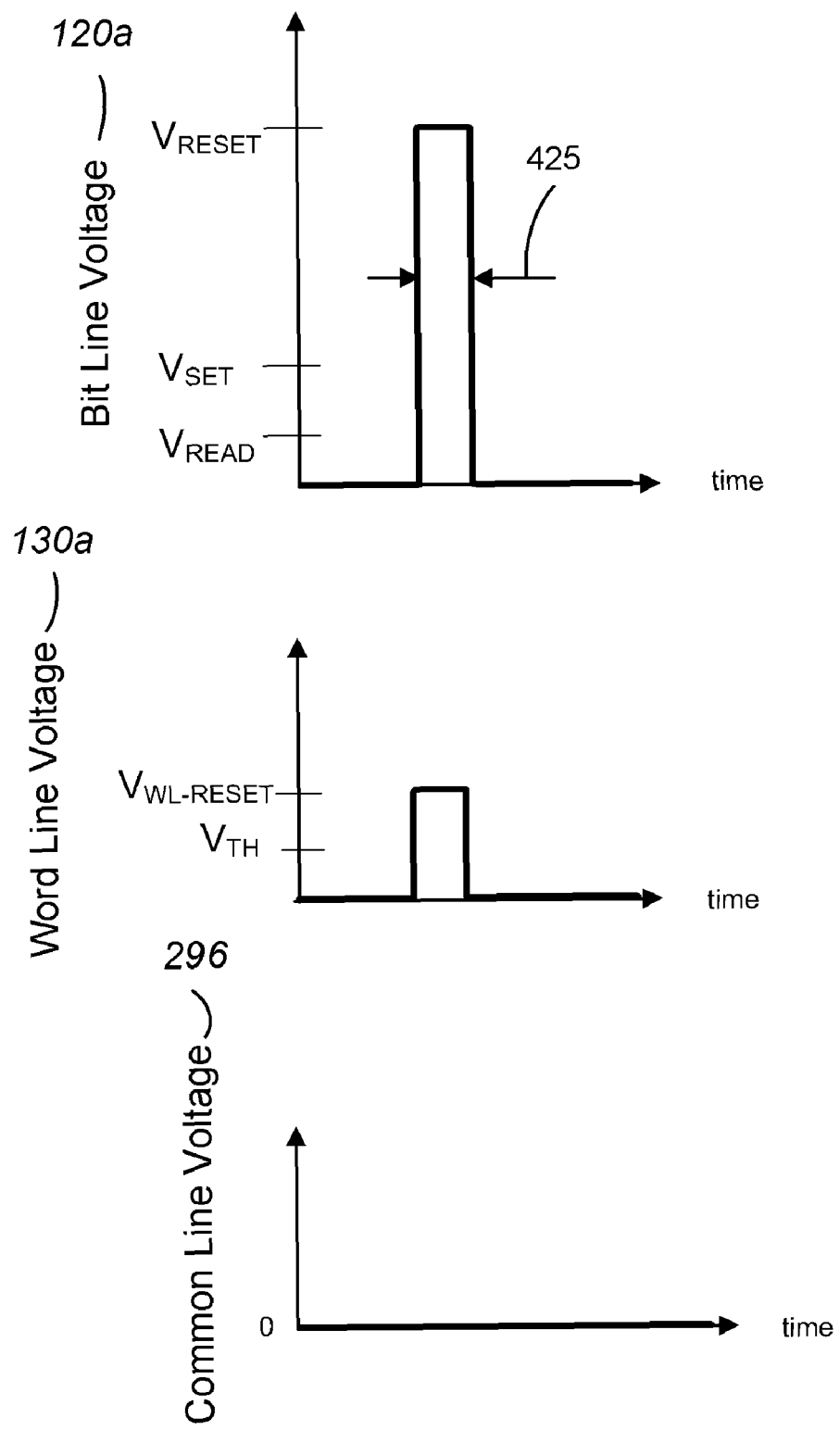

FIGS. 4A-4C are timing diagrams illustrating read, set, and reset operations of the memory cell 201 using the memory element 212 as a data storage element. As will be understood the timing diagrams of FIGS. 4A-4C are simplified and not necessarily to scale. During operation using the memory element 212 as a data storage element the voltage on node 215 of the capacitor 215 will fluctuate because node 215 is along the current path 280 through the memory element 212.

FIG. 4A illustrates a timing diagram of a read bias arrangement 400 for a read (or sense) operation of the memory element 212. The read bias arrangement 400 comprises applying a voltage $V_{WL-READ}$ to the word line 130a above the threshold voltage $V_{TH}$ of the access transistor 210 of the memory cell 201, and applying a voltage pulse having a pulse height of $V_{READ}$ and pulse width of 405 to the bit line 120a to induce a current to flow in path 280 on the bit line 120a and through the memory element 212 to the source line 296 (which is terminated to ground in this example). The current is insufficient for the memory element 212 to undergo a change in resistive state, and the resistance of the memory element 212 and thus the data value stored therein can be determined by comparison of the current on the bit line 120a to a suitable reference by sense amplifiers of block 124.

FIG. 4B illustrates a timing diagram of a set bias arrangement 410 for a set (or program) operation of the memory element 212. The set bias arrangement 410 comprises applying a voltage $V_{WL-SET}$ to the word line 130a above the threshold voltage $V_{TH}$ of the access transistor 210 of the memory cell 201, and applying a voltage pulse having a pulse height of $V_{SET}$ and pulse width of 415 to the bit line 120a to induce a current to flow in path 280. The current is sufficient to raise the temperature of at least a portion of the active region above the transition temperature of the phase change material and cause a transition of at least a portion of the active region from the amorphous phase to the crystalline phase, this transition lowering the resistance of the memory element 212 and setting the memory cell 201 to the set state.

FIG. 4C illustrates a timing diagram of a reset bias arrangement 420 for a reset (or erase) operation of the memory element 212. The reset bias arrangement 420 comprises applying a voltage $V_{WL-RESET}$ to the word line 130a above the threshold voltage $V_{TH}$ of the access transistor 210 of the memory cell 201, and applying a voltage pulse having a pulse height of $V_{RESET}$ and pulse width of 425 to the bit line 120a to induce a current to flow in path 280. The current is sufficient to raise the temperature of an active region of the memory element 212 above the transition temperature of the phase change material and also above the melting temperature to place the active region in a liquid state. The current is then terminated, for example by terminating the voltages on the word line 130a and bit line 120a, resulting in a relatively quick quenching time as the active region cools to stabilize to a high resistance generally amorphous phase.

In the illustrated embodiment of FIGS. 4A-4C, the bias arrangements each comprise applying voltages to the word line 130a and bit line 120a while the source line 296 is grounded, although it will be understood that other bias arrangements can alternatively be used. More generally, the bias arrangements of each operation may comprise a set of one or more pulses applied the bit line 120a, and/or word line 130a, and/or source line 296 to induce the appropriate current to flow in path 280. The number of pulses and the pulse shapes, including the voltage levels and pulse widths, of each bias arrangement can be determined empirically for each embodiment.

Volatile Operation

The memory cell 201 can also operate using the capacitor 214 as a data storage element in a manner similar to a conventional one-transistor, one-capacitor DRAM memory cell. During operations using the capacitor 214 as a storage element, the common source line 296 is floating in order to provide a high resistance path to minimize charge leakage from node 215 of the capacitor 214. Also, the programmable resistance memory element 212 can be placed in the higher resistance reset state to further increase the resistance path.

Figure 5A:
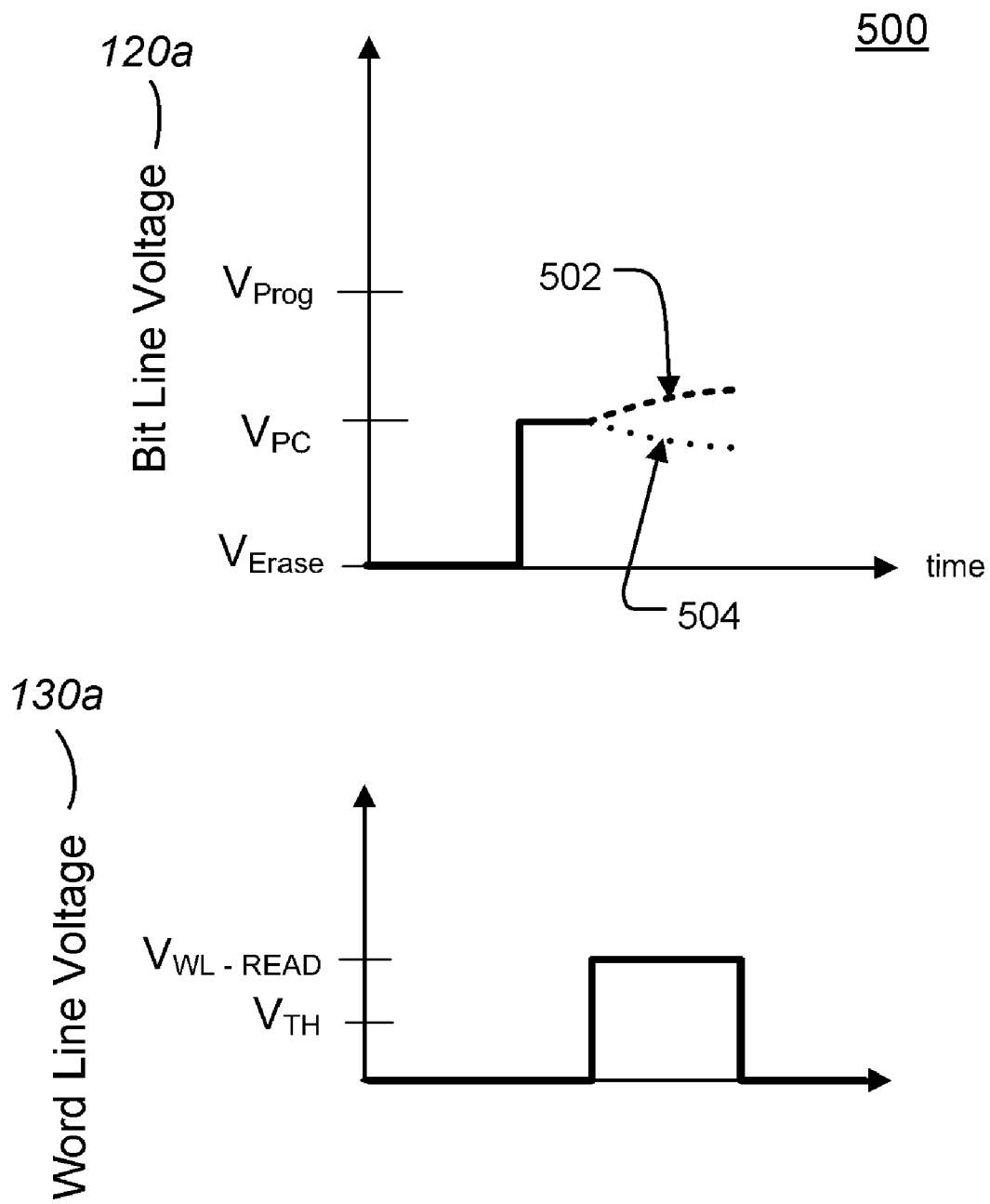
FIGS. 5A-5C are timing diagrams illustrating read, program, and erase operations of a selected memory cell using the capacitor as a data storage element.
Figure 5B:
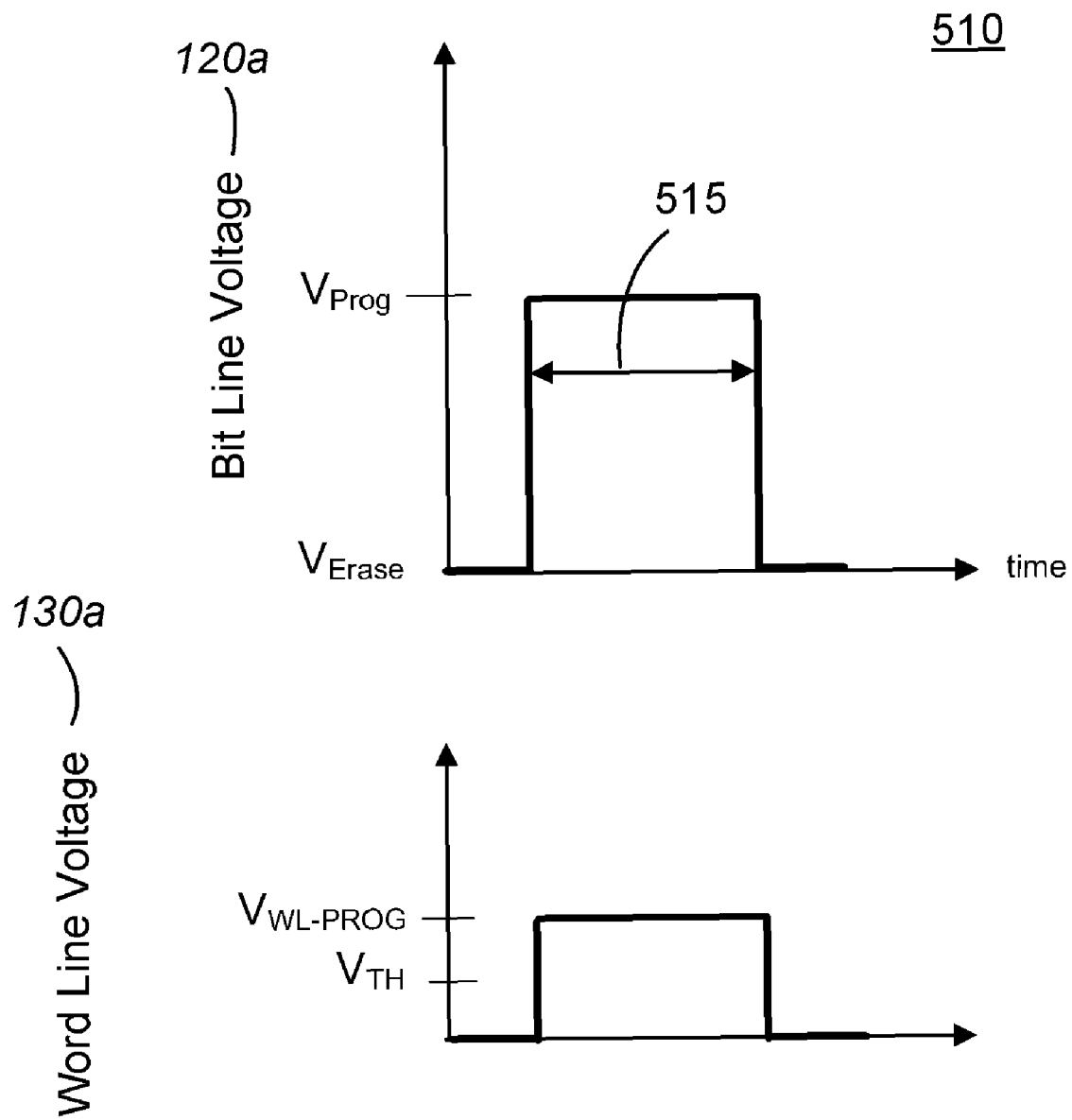
Figure 5C:
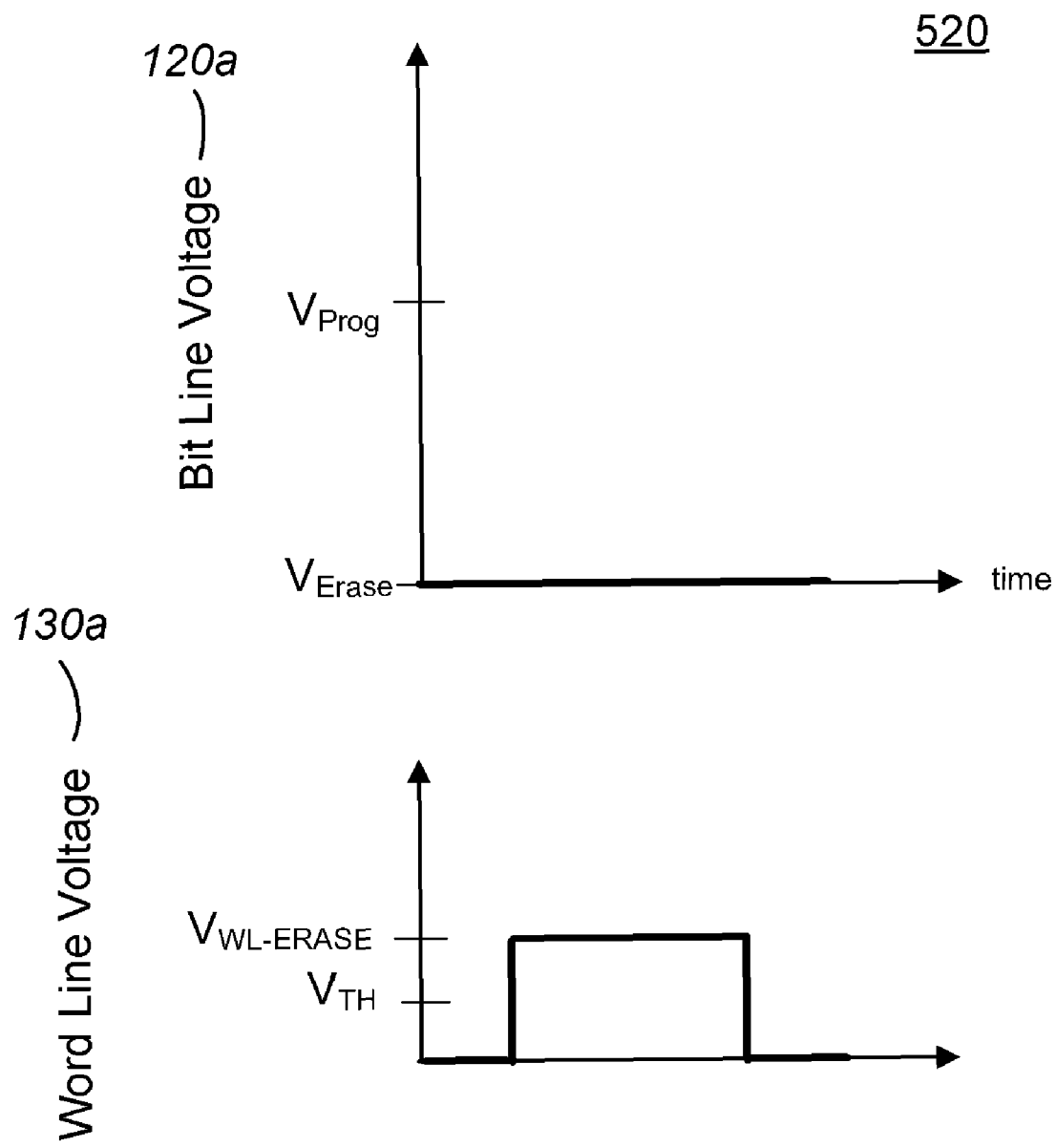

FIGS. 5A-5C are timing diagrams illustrating read, program, and erase operations of the memory cell 201 using the capacitor 214 as a data storage element. As will be understood the timing diagrams of FIGS. 5A-5C are simplified and not necessarily to scale.

FIG. 5A illustrates a timing diagram of a read bias arrangement 500 for a read (or sense) operation of the capacitor 214. The read bias arrangement 500 comprises first pre-charging the bit line 120a to a pre-charge voltage $V_{PC}$. In the illustrated embodiment the pre-charge voltage $V_{PC}$ on the bit line 120a is less than the voltage $V_{PROG}$ applied to the bit line 120a to program the capacitor 214, and is greater than the voltage $V_{ERASE}$ applied to the bit line 120a to erase the capacitor 214 (discussed below).

Next, a voltage $V_{WL-READ}$ above the threshold voltage $V_{TH}$ of the access transistor 210 is applied to the word line 130a to couple the first node 215 of the capacitor 214 to the bit line 120a. As a result, charge is shared between the first node 215 and the bit line 120a, thereby causing a change in the voltage on the bit line 120a. This change in voltage on the bit line 120a depends upon the initial voltage at node 215, and thus depends upon the data value stored in the capacitor 214.

If the capacitor 214 is in an erased state, the initial voltage on node 215 is less than $V_{PC}$ and the voltage on the bit line 120a will decrease slightly and follow curve 504. If the capacitor is in a programmed state, the initial voltage on node 215 is greater than $V_{PC}$ and the voltage on the bit line 120a will increase slightly and follow curve 502. Thus, the data value stored in the capacitor 214 of the memory cell 201 may be determined by detecting the change in voltage on the bit line 120a, for example by comparison of the voltage on the bit line 120a with a suitable reference by sense amplifiers of block 124.

Due to the charge sharing between the bit line 120a and the first node 215, the read bias arrangement 500 destructively reads the data value stored in the capacitor 214. Thus, following the read operation 500 the data value is re-written by applying an erase or a program operation (discussed below) depending upon the data value that was detected.

FIG. 5B illustrates a timing diagram of a program bias arrangement 510 for a program operation of the capacitor 214. The program bias arrangement 510 comprises applying a voltage pulse having a pulse height of $V_{PROG}$ and a pulse width 515 to the bit line 120a and applying a voltage $V_{WL\text{-}PROG}$ to the word line 130a. The voltage $V_{WL\text{-}PROG}$ is above the threshold voltage $V_{TH}$ of the access transistor 210, thereby coupling the first node 215 of the capacitor to the bit line 120a to charge the node 215 of the capacitor 214 to a programmed voltage and place the capacitor 214 in a programmed state.

FIG. 5C illustrates a timing diagram of an erase bias arrangement 510 for a erase operation of the capacitor 214. The erase bias arrangement 520 comprises applying a voltage $V_{ERASE}$ (ground in this example) to the bit line 120a and applying a voltage $V_{WL\text{-}ERASE}$ to the word line 130a. The voltage $V_{WL\text{-}ERASE}$ is above the threshold voltage $V_{TH}$ of the access transistor 210, thereby coupling the first node 215 of the capacitor to the bit line 120a to reduce the voltage on node 215 of the capacitor 214 to an erased voltage and place the capacitor 214 in an erased state.

Refresh operations, by either a program or erase operation, are also executed in order to periodically refresh the charge stored on node 215 of the capacitor 214 to correct for charge leakage. For example, a refresh cycle as commonly used in DRAM technology can be executed so that each capacitor has its memory state refreshed at least once every 10 to 150 microseconds in representative embodiments. Shorter or longer refresh cycles could be implemented according to the particular characteristics of the memory cell capacitor charge storage dynamics.

It will be understood that bias arrangements other than those illustrated in FIGS. 5A-5C can alternatively be used. More generally, the bias arrangements of each operation may comprise a set of one or more pulses applied the bit line 120a, and/or word line 130a. The number of pulses and the pulse shapes, including the voltage levels and pulse widths, of each bias arrangement can be determined empirically for each embodiment.

As described above, the memory cell 201 can be operated using either the capacitor 214 or the programmable resistance memory element 212 as a data storage element. The capacitor 214 and the memory element 212 provide volatile and non-volatile modes of operation respectively for the memory cell 201. The capacitor 214 provides fast program/erase speeds and sufficient data retention for high speed DRAM operation. The memory element 212 provides nonvolatile data storage. As a result, the memory cell 201 can provide the different memory performance requirements demanded by various functions of an integrated circuit. The volatile and nonvolatile modes provide different operational characteristics such as switching speed, cycle endurance, operational current, and data retention within the same memory cell 201.

Transfer Operation from Memory Element to Capacitor

The memory cell 201 can also be operated to transfer the data value stored in the memory element 212 directly to the capacitor 214 without performing a read operation. This direct transfer is referred to herein as a "restore operation".

The transfer may occur, for example, in response to an initialization event such as the application of power ("power up") to the integrated circuit 110. For example, the data value stored in the memory element 212 during power off conditions of the integrated circuit 110 can be transferred directly to the capacitor 214 for use during operation of the integrated circuit. As another example, the transfer may occur as a result of a change in memory needs of the integrated circuit 110.

Figure 6:
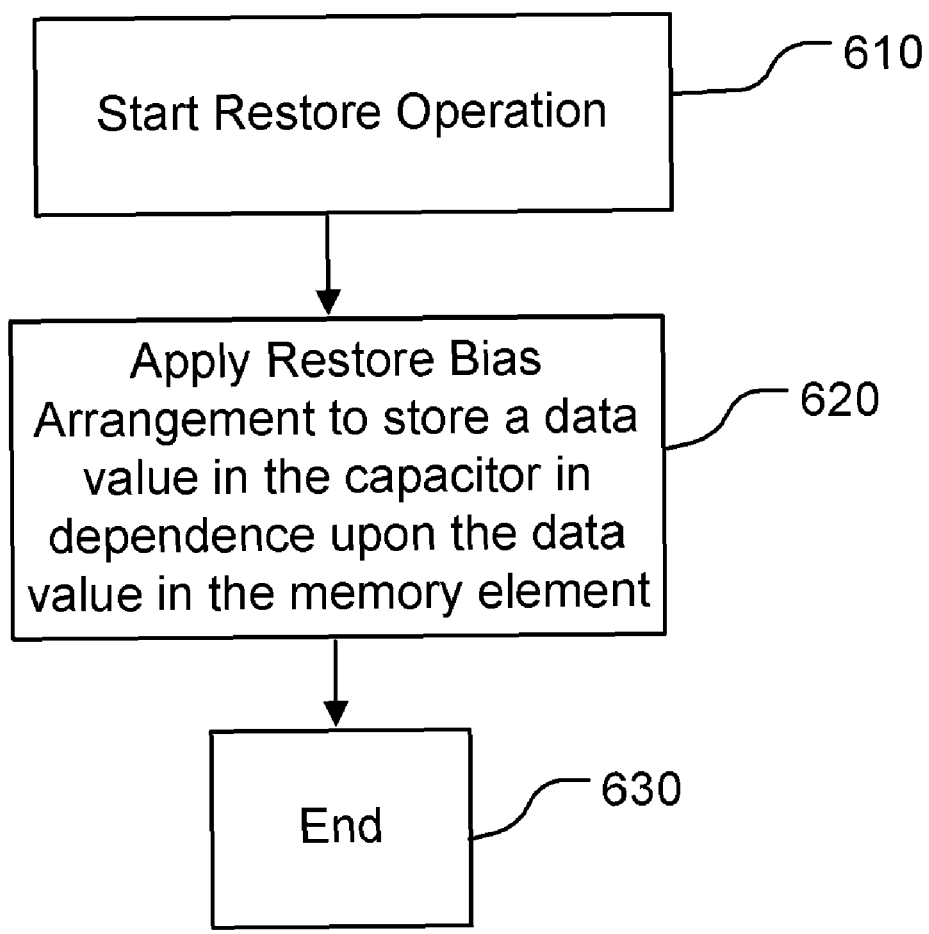
FIG. 6 is a flow diagram of a restore operation of applying a restore bias arrangement to a selected memory cell of FIG. 2.
Figure 7:
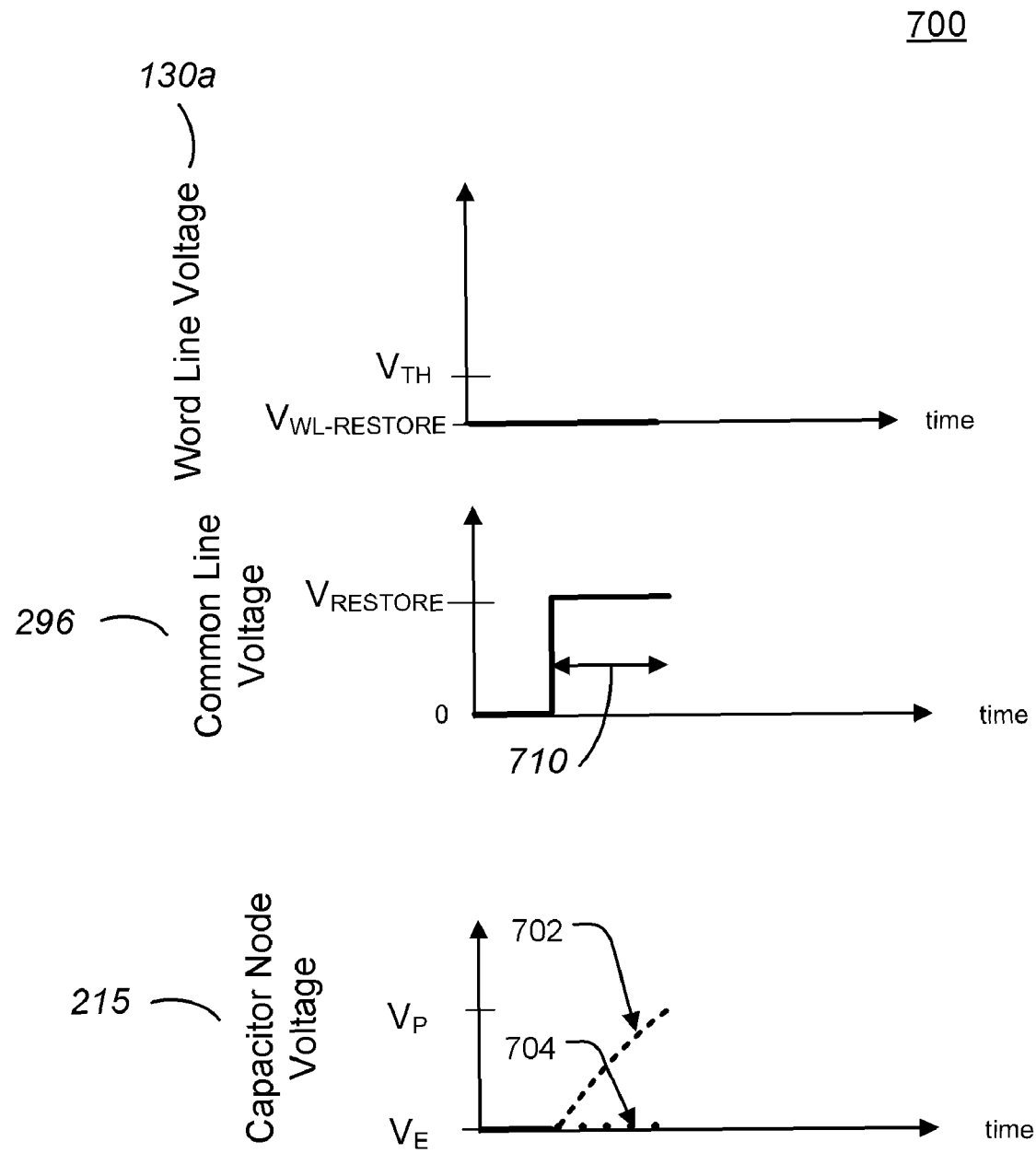
FIG. 7 is a timing diagram of the restore bias arrangement of the restore operation of FIG. 6.

FIG. 6 is a flow diagram of a restore operation 600 of applying a restore bias arrangement 700 to the memory cell 201, and FIG. 7 is a timing diagram of the restore bias arrangement 700. As will be understood, the timing diagram of FIG. 7 is simplified and not necessarily to scale.

The restore operation 600 begins at step 610, for example in response to an initialization event such as power-up of the integrated circuit 110.

At step 620 a restore bias arrangement 700 is applied to the memory cell 201 to directly store a data value in the capacitor 214 in dependence upon the data value stored in the memory element 212.

Referring to FIG. 7, the restore bias arrangement of step 620 comprises applying a voltage $V_{WL\text{-}RESTORE}$ (ground in this example) less than the threshold voltage $V_{TH}$ of the access transistor and applying a restore voltage $V_{BIAS}$ for a period of time 710 to the common source line 296. Because of the large difference in the resistance of the memory element 212 between the set and reset states, if the memory element 212 is in the lower resistance set state the voltage on the first node 215 will change at a much faster rate than if the memory element 212 is in the higher resistance state. Thus, if the memory element 212 is in the lower resistance set state, the voltage $V_{RESTORE}$ and the period of time 710 are sufficient to increase the voltage on node 215 along curve 702 to a programmed voltage $V_P$ indicating the capacitor 214 is in the programmed state. However, if the memory element 212 is in the higher resistance reset state, the voltage $V_{RESTORE}$ and the period of time 710 are insufficient to cause a significant increase in the voltage on node 215, and the voltage on node 215 after time 704 is at a voltage $V_E$ indicating that the capacitor is in the erased state.

After time 710 the common source line 296 is set to a floating condition and the restore operation ends at step 530. The memory cell 201 can then continue to be operated using the capacitor 214 as a storage element using the read, program, erase, and refresh operations as discussed above.

The restore operation 600 was discussed above with reference to memory cell 201. However, since the restore bias arrangement 700 of the restore operation 600 was performed by applying a restore voltage to the common line 296, the restore operation 600 can be performed as a block (or sector) restore operation of all of the memory cells sharing common line 296.

Figure 8:
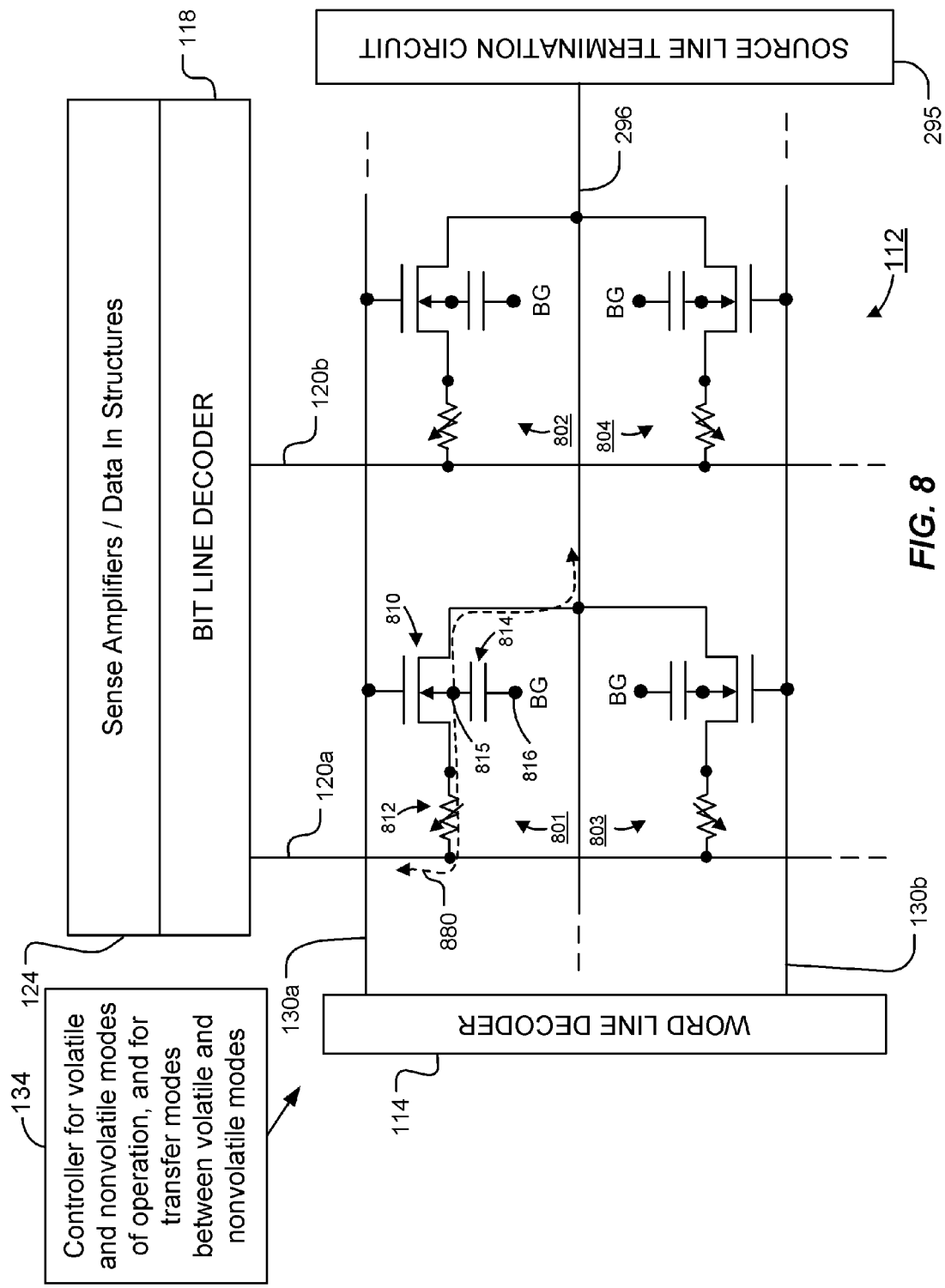
FIG. 8 illustrates a schematic diagram of a second embodiment of the array of the integrated circuit of FIG. 1.

FIG. 8 illustrates a schematic diagram of a second embodiment of array 112 of FIG. 2. In FIG. 8 the memory cells of the array 112 are implemented using a floating body cell (FBC) which utilizes transient charge storage in the floating channel body of access transistors formed on a silicon on insulator (SOI) or the like. The stored charge causes a detectable shift in the threshold voltage of the access transistor, which is used to indicate stored data. Additional details concerning floating body cells can be seen, for example, in Nitayama et al., "Overview and Future Challenge of Floating Body Cell (FBC) Technology for Embedded Applications", International Symposium on VLSI Technology, Systems, and Applications, April 2006, pp. 1-3, which is incorporated by reference herein. See also U.S. Pat. No. 7,208,799 and U.S. Pat. No. 6,661,042, both of which are incorporated by reference herein.

The floating channel body takes the place of a discrete capacitor by using the capacitance formed between the floating channel body of the transistor and the underlying substrate. As a result, a floating body cell is sometimes referred to as a "capacitorless" cell. However, since charge stored therein is used to indicate a stored data value, the capacitance formed between the floating channel body of the transistor and the underlying substrate is referred to herein as a capacitor.

Each of the memory cells of the array 112 of FIG. 8 has a field effect transistor, a programmable resistance memory element (represented as a variable resistor in the Figure), and a charge storage capacitor utilizing transient charge storage in the floating channel body of the transistor. As described in more detail below, each memory cell can be operated as volatile memory using the floating channel body acting as the first node of the capacitor to store a data value, and can be operated as nonvolatile memory using the programmable resistance memory element as a data storage element. The memory cells can also be operated in a transfer mode to directly transfer a data value stored in the programmable resistance memory element to the capacitor, or vice versa.

It will be understood that the memory array 112 is not limited to the array configuration illustrated in FIG. 8, and other configurations can alternatively be used.

Memory cell 801 is representative of the memory cells of array 112 and comprises transistor 810, programmable resistance memory element 812, and capacitor 814. Word line 130a is coupled to the gate of the access transistor 810, common source line 296 is coupled to the source of the access transistor 810, and memory element 812 is arranged between the drain of the access transistor and the bit line 120a.

The capacitor 814 has a first node 815 comprising a portion of the floating channel body of the access transistor 810. The capacitor 816 has a second node 816 or "back gate" (BG) underlying the floating channel body of the access transistor, the second node 816 separated from the floating channel body by an insulator layer. The second node 816 is coupled to a voltage source for applying a back gate bias voltage.

As described in more detail below, the memory cell operates as high speed DRAM memory or nonvolatile memory depending upon whether the capacitor 814 or the programmable resistance memory element 812 is used as a data storage element. During volatile memory operation, the memory cell 801 stores a data value as charge on node 815 within the floating channel body of the transistor 810. During nonvolatile operation, the memory cell 801 stores a data value depending upon the resistance of the memory element 812.

Figure 9:
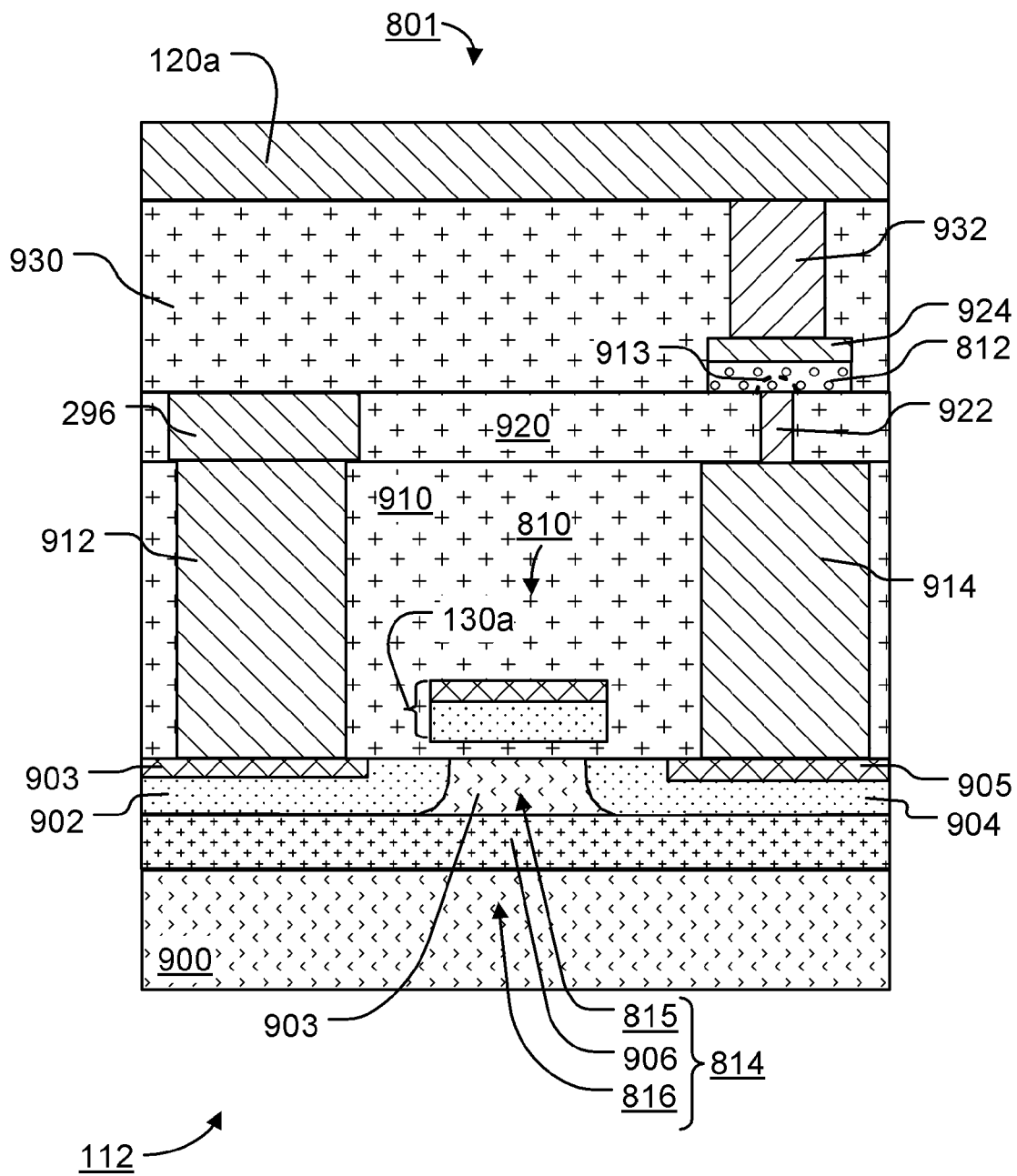
FIG. 9 illustrates a cross-sectional view of a portion of an embodiment of memory cells arranged in the array of FIG. 8.

FIG. 9 is a cross-sectional view of a portion of an embodiment of memory cells (including representative memory cell 801) arranged in the array 112 of FIG. 8. The cross-section of FIG. 9 is taken along the bit lines 120.

The field effect transistor 810 of the memory cell 801 includes first and second terminals 902, 904 separated by a floating channel body 903 acting as the first node 815 of the capacitor 814. The first and second terminals 902, 904 comprise doped semiconductor material 903 having a conductivity type opposite that of the channel region 903. In the illustrated embodiment the floating channel body 903 comprises doped P-type material and the first and second terminals 902, 904 comprise doped N-type material, the first terminal 902 acting as the source region and the second terminal 904 acting as the drain region.

The floating channel body 903 and the first and second terminals 902, 904 are on insulating layer 906. The insulating layer 906 may comprise, for example, silicon dioxide. Alternatively, the insulating layer 906 may comprise other materials.

Semiconductor substrate 900 underlies the insulating layer 906 and is coupled to a voltage source for applying a back gate bias voltage, described in more detail below. The portion of substrate 900 underlying the floating channel body 903 acts as the second node 816 of the capacitor 814. Alternatively, other types of conductive materials can be used for layer 900.

Word line 130a acting as the gate of the transistor 810 of the memory cell 801 extends into and out of the cross-section illustrated in FIG. 3. The word line 130a overlies the floating channel body 815 and comprises doped polysilicon material and a silicide layer on the doped polysilicon.

Conductive caps 903, 905 comprising silicide are on the first and second terminals 902, 904 respectively. The conductive caps 903, 905 may comprise, for example, a silicide containing Ti, W, Co, Ni, or Ta. The conductive caps 903, 905 provide low resistance contacts between the first and second terminals 902, 904 and conductive plugs 912, 914.

The conductive plugs 912, 914 extend through dielectric 910. The conductive plugs 912, 914 may comprise, for example, tungsten. Other exemplary materials that could also be used for the conductive plugs 912, 914 include, for example, Ti, Mo, Al, Ta, Cu, Pt, Ir, La, Ni, and Ru. The conductive plug 912 couples the common source line 296 to the conductive cap 903.

The memory cell 801 includes a bottom electrode 922 on the conductive plug 914. The bottom electrode 922 extends through dielectric 920 to contact a bottom surface of the programmable resistance memory element 812. The programmable resistance memory element 812 may comprise, for example, one or more materials discussed above with reference to the memory element 212 of FIG. 3.

The memory cell 801 also includes a top electrode 924 on the programmable resistance memory element 812. The top and bottom electrodes 924, 922 may each comprise, for example, one or more of the materials discussed above with reference to the electrodes 324, 322 of FIG. 3.

Conductive plug 932 extends through dielectric 930 to couple the top electrode 924 to the bit line 120a. The dielectric 910, 920, 930 may each comprise, for example, silicon dioxide. Alternatively other dielectric materials may be used.

During operation using the memory element 812 as the data storage element for the memory cell 801, the active region 913 is the region of the programmable resistance memory element 812 in which memory material is induced to change between at least two solid phases. In FIG. 9 the memory element 812 and the electrodes 822, 824 are arranged in a mushroom-type configuration. Alternatively, the memory element 812 and the electrodes 822, 824 can be arranged in various other types of configurations, for example those discussed above with reference to FIG. 3.

During operation using the capacitor 814 as the data storage element for the memory cell 801, the threshold voltage of the access transistor 810 is modulated by adding or removing charge stored on node 815 of the floating channel body 903.

Referring back to the schematic diagram of FIG. 8, operation of the memory cell 801 can be achieved by controller 134 controlling the application of bias arrangement supply voltages and current sources (See FIG. 1, reference number 136) for the application of bias arrangements including bias arrangements for volatile, nonvolatile, and transfer modes of operation of the memory cells. The bias arrangements can include voltages and/or currents applied to the word line 130a, bit line 120a, and source line 296. The level and duration of the voltages and/or currents applied is dependent upon whether the capacitor 814 or the memory element 812 is used as a data storage element, and is also dependent upon the operation performed, e.g. a reading operation or a writing operation. The levels and durations of the voltages and/or currents applied can be determined empirically for each embodiment. The various modes of operation are explained in more detail below.

Nonvolatile Operation

The memory cell 801 can be operated using the memory element 812 as a data storage element by applying read, set, and reset bias arrangements to induce current flow along current path 880 from the bit line 120a to the source line 296, or vice-versa. During nonvolatile operation using the memory element 812 as a data storage element, the access transistor 810 is preferably in the low threshold erased state (discussed in more detail below) so that a higher current can be obtained along path 880 for a given voltage applied to the word line 130a.

The memory element 812 can be read, programmed to the lower resistance set state, and reset to the high resistance reset state in a manner similar to that discussed above with respect to memory element 212 of FIG. 2 and the timing diagrams of FIGS. 4A-4C. More generally, the bias arrangements of each operation may comprise a set of one or more pulses applied the bit line 120a, and/or word line 130a, and/or source line 296 to induce current to flow in path 880. The number of pulses and the pulse shapes, including the voltage levels and pulse widths, of each bias arrangement can be determined empirically for each embodiment.

Volatile Operation

The memory cell 801 is programmed and erased using the capacitor 814 as a data storage element by applying appropriate voltages to the source line 296, bit line 120a, word line 130a, and second node 816 of the capacitor 814 to change the amount of charge stored on node 815 within the floating channel body of the access transistor 810. During operation using the capacitor 814 as a data storage element, the programmable resistance memory element 812 is preferably in the lower resistance set state so that a higher magnitude resultant voltage can be obtained at the drain of the access transistor for a given voltage applied to the bit line 120a. This higher magnitude resultant voltage can be used to more efficiently programming and erase the capacitor 814.

Figure 10A:
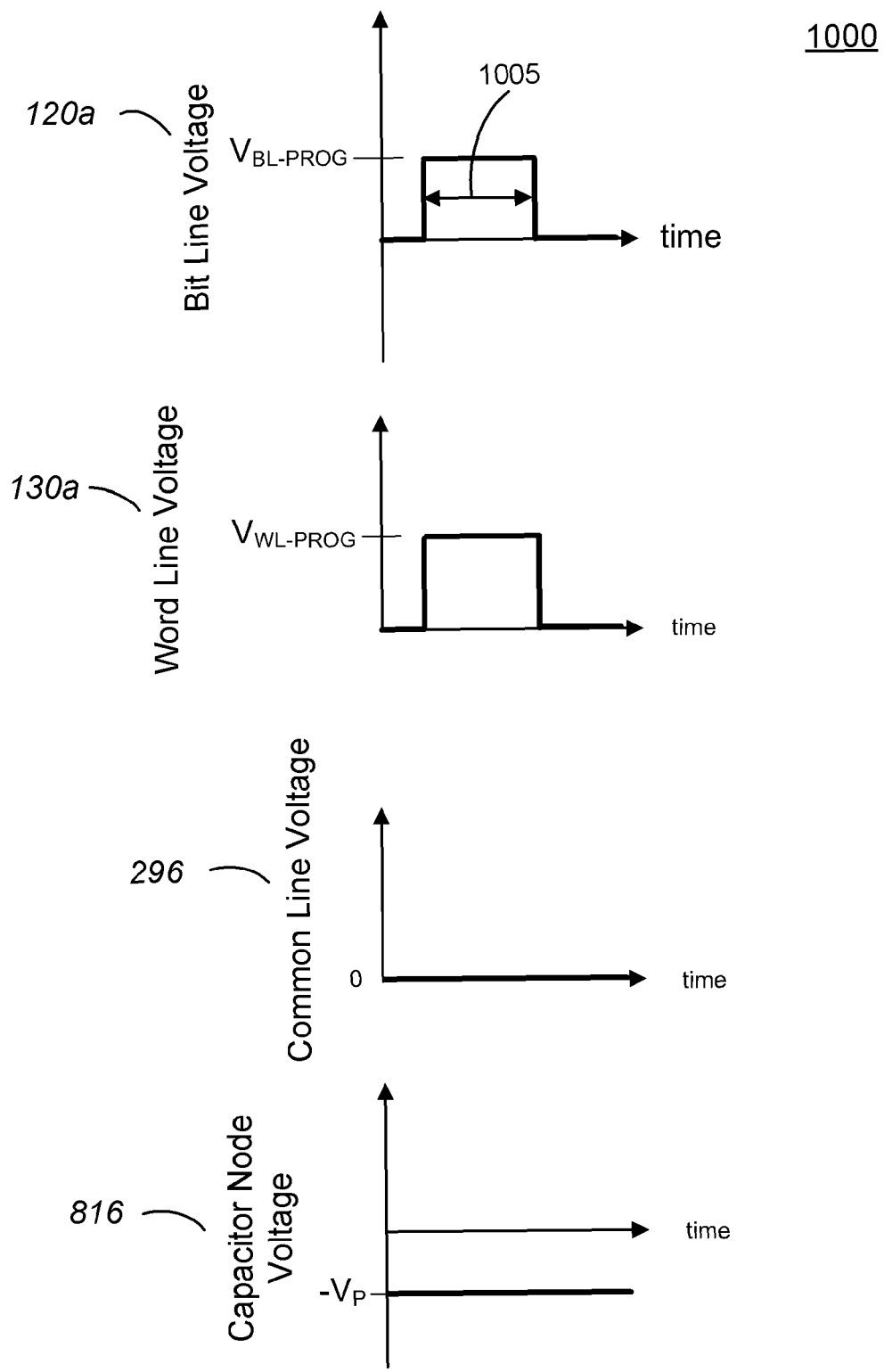
FIGS. 10A-10C are timing diagrams illustrating program, erase, and read bias arrangements for operation of a selected memory cell using the capacitor as a data storage element.
Figure 10B:
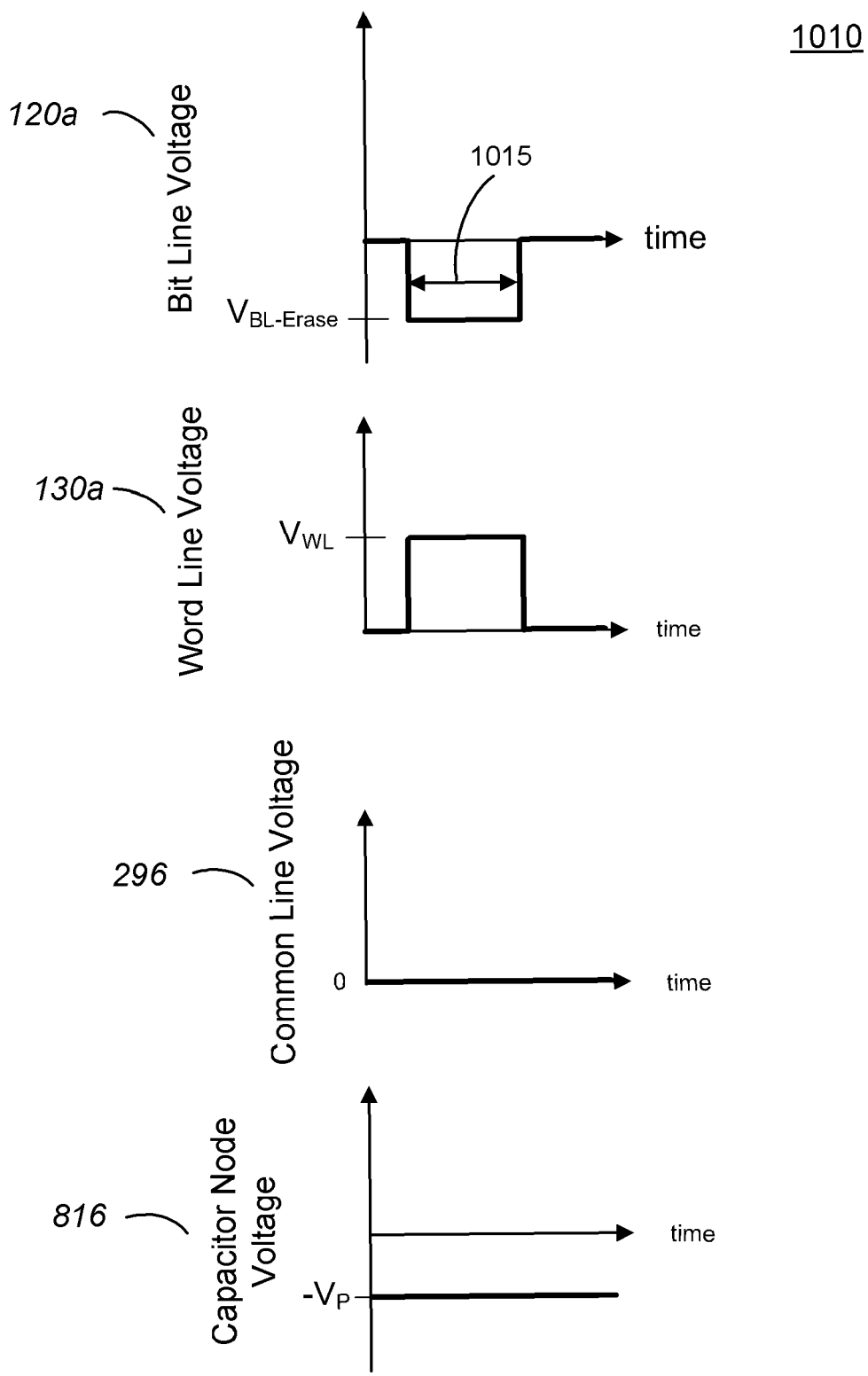
Figure 10C:
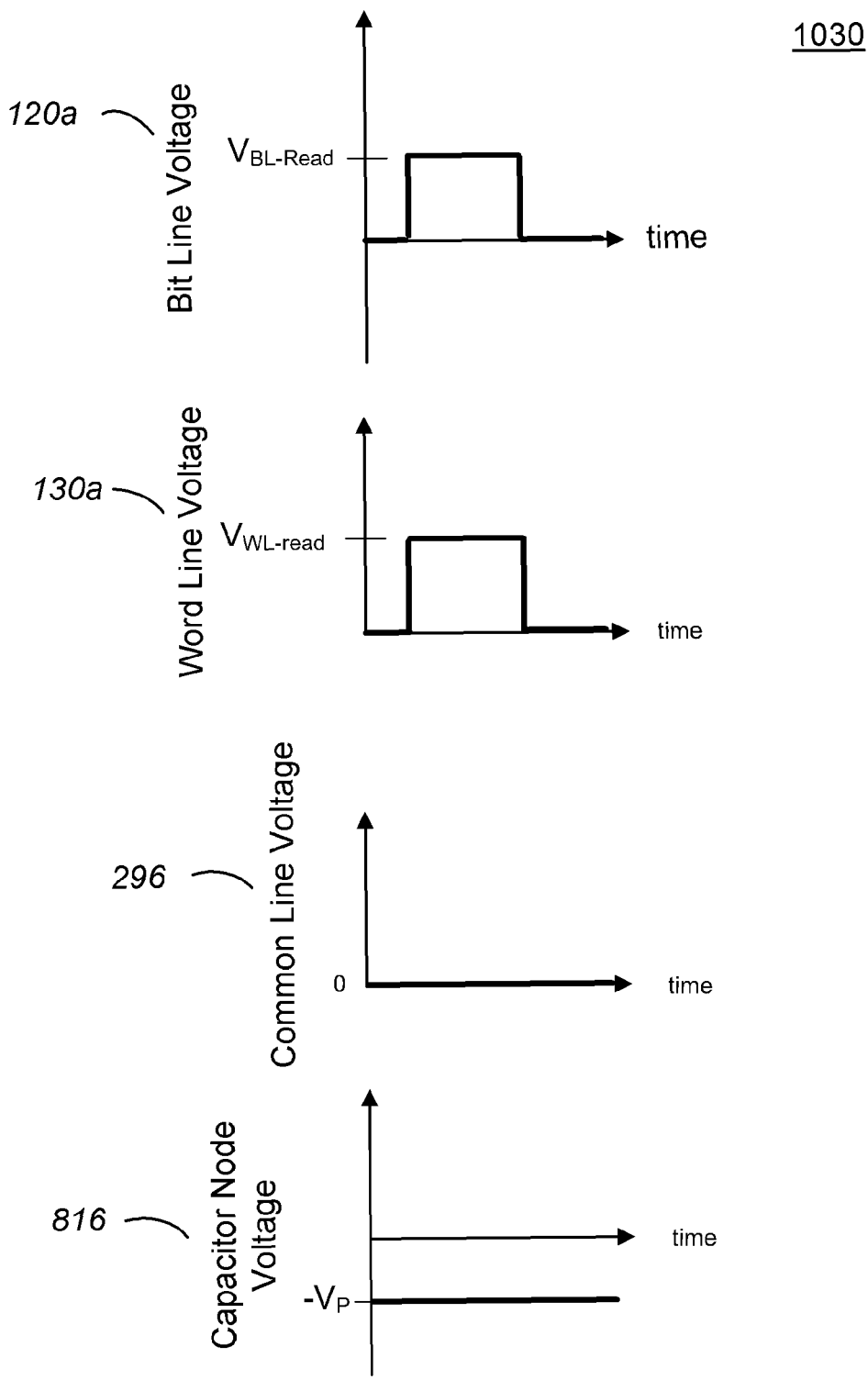

FIGS. 10A-10C are timing diagrams illustrating program, erase, and read bias arrangements for operation of the memory cell 801 using the capacitor 814 as a data storage element. As will be understood the timing diagrams of FIGS. 10A-10C are simplified and not necessarily to scale.

In a program operation of the capacitor 814, holes are accumulated in the floating channel body of the transistor 810 to increase the voltage on node 815 and set transistor 810 to a programmed threshold state. FIG. 10A illustrates a timing diagram of a program bias arrangement 1000 for a program operation of the capacitor 814. A voltage $V_{BL-Prog}$ having a pulse width 1005 is applied to the bit line 120a, a voltage $V_{WL-PROG}$ is applied to the word line 130a, and the common source line 296 is supplied a ground potential. The second node 216 of the capacitor is maintained at a negative voltage $-V_P$. The program bias arrangement 1000 creates holes by impact ionization (band to band hot hole programming) which are accumulated at the bottom surface of the floating channel body of the transistor 810 by the negative voltage $-V_P$ applied to the second node 816.

In an erase operation of the capacitor 814, the accumulated holes in the floating channel body of the transistor 810 are removed to decrease the voltage on node 815 and set transistor 810 to an erased threshold state. FIG. 10B illustrates a timing diagram of an erase bias arrangement 1010 for an erase operation of the capacitor 814. A voltage $V_{BL-Erase}$ having a pulse width 1015 is applied to the bit line 120a, a voltage $V_{WL}$ is applied to the word line 130a, and the common source line 296 is supplied a ground potential. The second node 816 of the capacitor is maintained at a negative voltage $-V_P$. The erase bias arrangement 1010 extracts accumulated holes from the floating channel body of the transistor 810 to the bit line 120a.

FIG. 10C illustrates a timing diagram of a read bias arrangement 1030 for a read operation of the capacitor 814. A voltage $V_{WL-Read}$ is applied to the word line 130a, a voltage $V_{BL-Read}$ is applied to the bit line 120a, the common source line 296 is supplied a ground potential as shown in FIG. 9C. The second node 216 of the capacitor 814 is maintained at a negative voltage $-V_P$. If the access transistor 810 is in the erased threshold state, the voltage $V_{WL-Read}$ is sufficient to turn on the access transistor 810 and induce current to flow on the bit line 120a and along current path 880. However, if the access transistor 810 is in the program threshold state, the voltage $V_{WL-Read}$ is insufficient to turn on the access transistor 810. Thus, the data value stored in the capacitor 814 of the memory cell 801 may be determined by comparison of the current on the bit line 120a with a suitable reference by sense amplifiers of block 124.

Refresh operations, by either a program or erase operation, are also executed in order to periodically refresh the charge stored on the capacitor 814 to correct for charge leakage. For example, a refresh cycle as commonly used in DRAM technology can be executed so that each capacitor has its memory state refreshed at least once every 1 to 150 microseconds in representative embodiments. Shorter or longer refresh cycles could be implemented according to the particular characteristics of the memory cell capacitor charge storage dynamics.

It will be understood that bias arrangements other than those illustrated in FIGS. 10A-10C can alternatively be used. More generally, the bias arrangements of each operation may comprise a set of one or more pulses applied the bit line 120a, and/or word line 130a, and/or source line 296, and/or node 816. The number of pulses and the pulse shapes, including the voltage levels and pulse widths, of each bias arrangement can be determined empirically for each embodiment.

Transfer Operation from Memory Element to Capacitor

A restore operation 1100 can also be performed on the memory cell 801 to transfer the data value originally stored in the memory element 812 directly to the capacitor 814.

Figure 11:
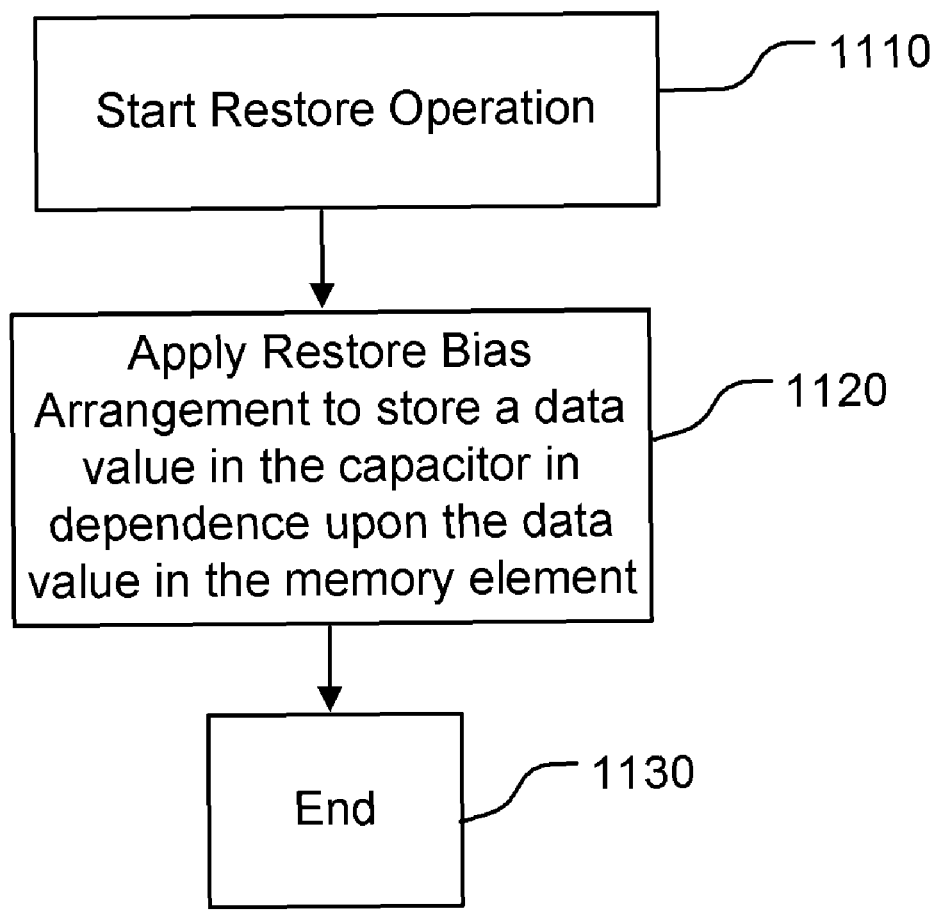
FIG. 11 is a flow diagram of a restore operation of applying a restore bias arrangement to a selected memory cell of FIG. 8.
Figure 12:
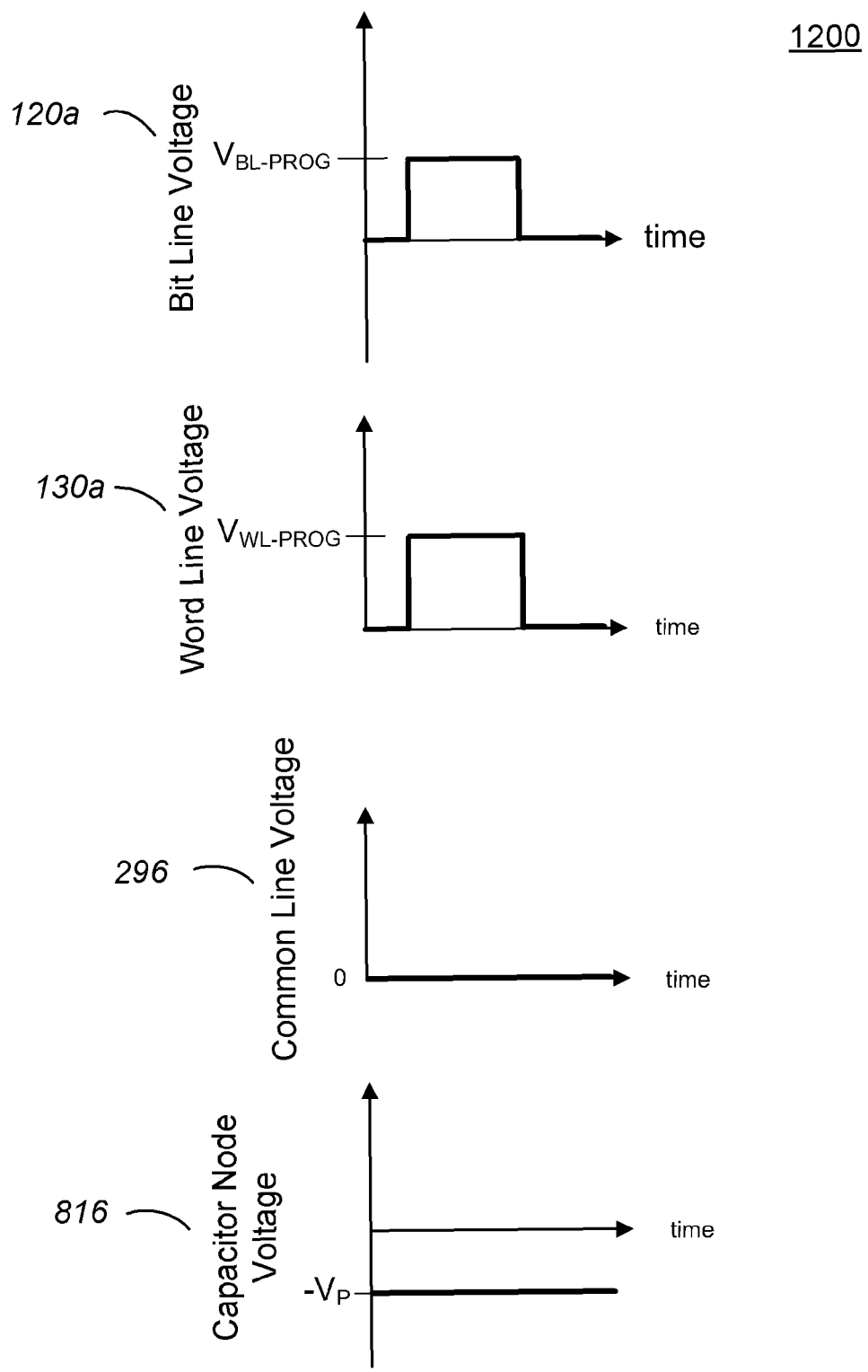
FIG. 12 is a timing diagram of the restore bias arrangement of the restore operation of FIG. 11.

FIG. 11 is a flow diagram of a restore operation 1100 of applying a restore bias arrangement 1200 to the memory cell 801, and FIG. 12 is a timing diagram of the restore bias arrangement 1200. As will be understood, the timing diagram of FIG. 12 is simplified and not necessarily to scale.

The restore operation 1100 begins at step 1110, for example in response to an initialization event such as power-up of the integrated circuit 110.

At step 1120 a restore bias arrangement 1200 is applied to the memory cell 801 to directly store a data value in the capacitor 814 in dependence upon the data value stored in the memory element 812.

Referring to FIG. 12, the restore bias arrangement 1200 comprises applying the program bias arrangement 1000 of FIG. 10A. A voltage $V_{BL-PROG}$ is applied to the bit line 120a, a voltage $V_{WL-PROG}$ is applied to the word line 130a, and the common source line 296 is supplied a ground potential. The second node 816 of the capacitor is maintained at a negative voltage $-V_P$. Because of the difference in the resistance of the memory element 812 between the set and reset states, the resultant voltage at the drain terminal of the access transistor 810 will be lower if the memory element 812 is in the reset state than if the memory element 812 is the set state. If the memory element 812 is in the higher resistance reset state, the resultant voltage at the drain terminal is insufficient to cause an accumulation of a sufficient number holes in the floating channel body, and the voltage on node 215 remains at a low voltage indicating the transistor 810 is in the erased threshold state.

If the memory element 812 is in the lower resistance set state, the resultant voltage at the drain terminal is sufficient to cause the accumulation holes in the floating channel body. This accumulation of holes causes an increase in the voltage on node 815 and sets a program threshold state in the transistor 810, as was discussed above with reference to FIG. 9A.

It will be understood that bias arrangements other than the restore bias arrangement 1200 illustrated in FIG. 12 can alternatively be used. More generally, the restore bias arrangement may comprise a set of one or more pulses applied the bit line 120a, and/or word line 130a, and/or source line 296, and/or second node 816 of the capacitor. The number of pulses and the pulse shapes, including the voltage levels and pulse widths, of the bias arrangement can be determined empirically for each embodiment.

Transfer Operation from Capacitor to Memory Element

The memory cell 801 can also be operated to directly transfer the data value originally stored in the capacitor 814 to the memory element 814.

For example, the data value stored in the capacitor 814 during operation of the integrated circuit 110 can be transferred directly to the memory element 814 for nonvolatile data storage during power off conditions of the integrated circuit 110. This transfer of the data value stored in the capacitor 814 to the memory element 812 is referred to herein as a "save operation". The transfer may occur, for example, in response to an event such as the beginning of a power down operation of the integrated circuit 110. As another example, the transfer may occur as a result of a change in memory needs of the integrated circuit 110.

Figure 13:
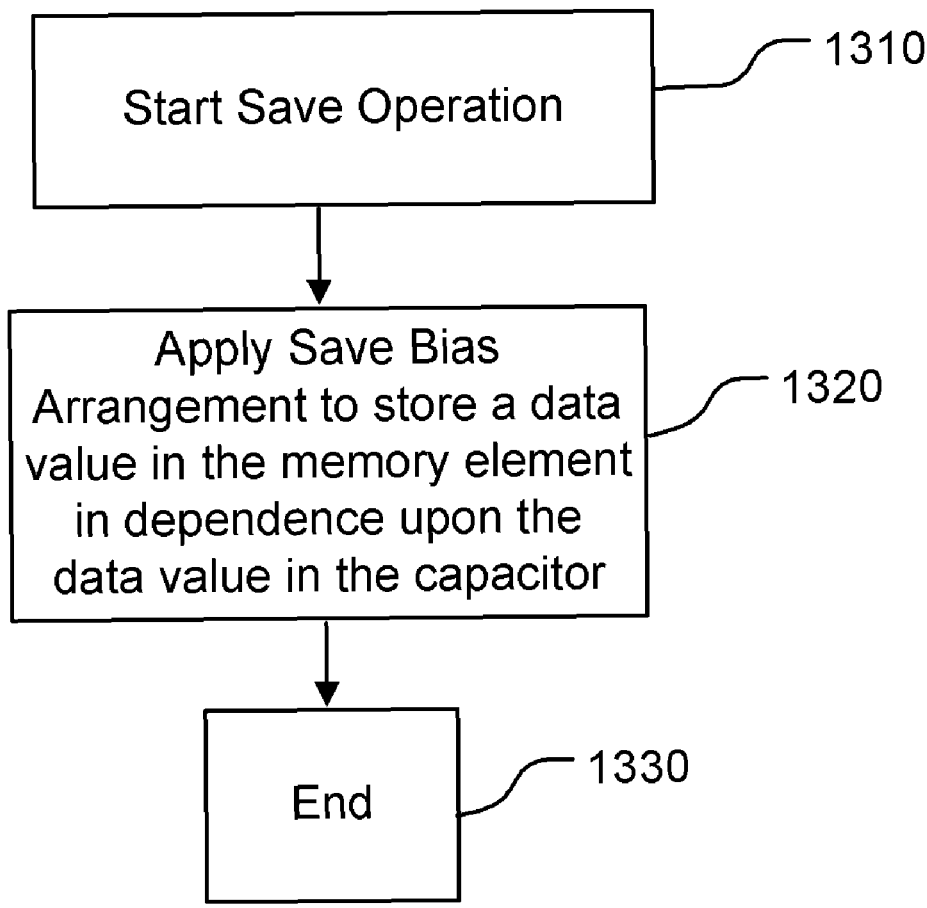
FIG. 13 is a flow diagram of a save operation of applying a save bias arrangement to a selected memory cell of FIG. 8.
Figure 14:
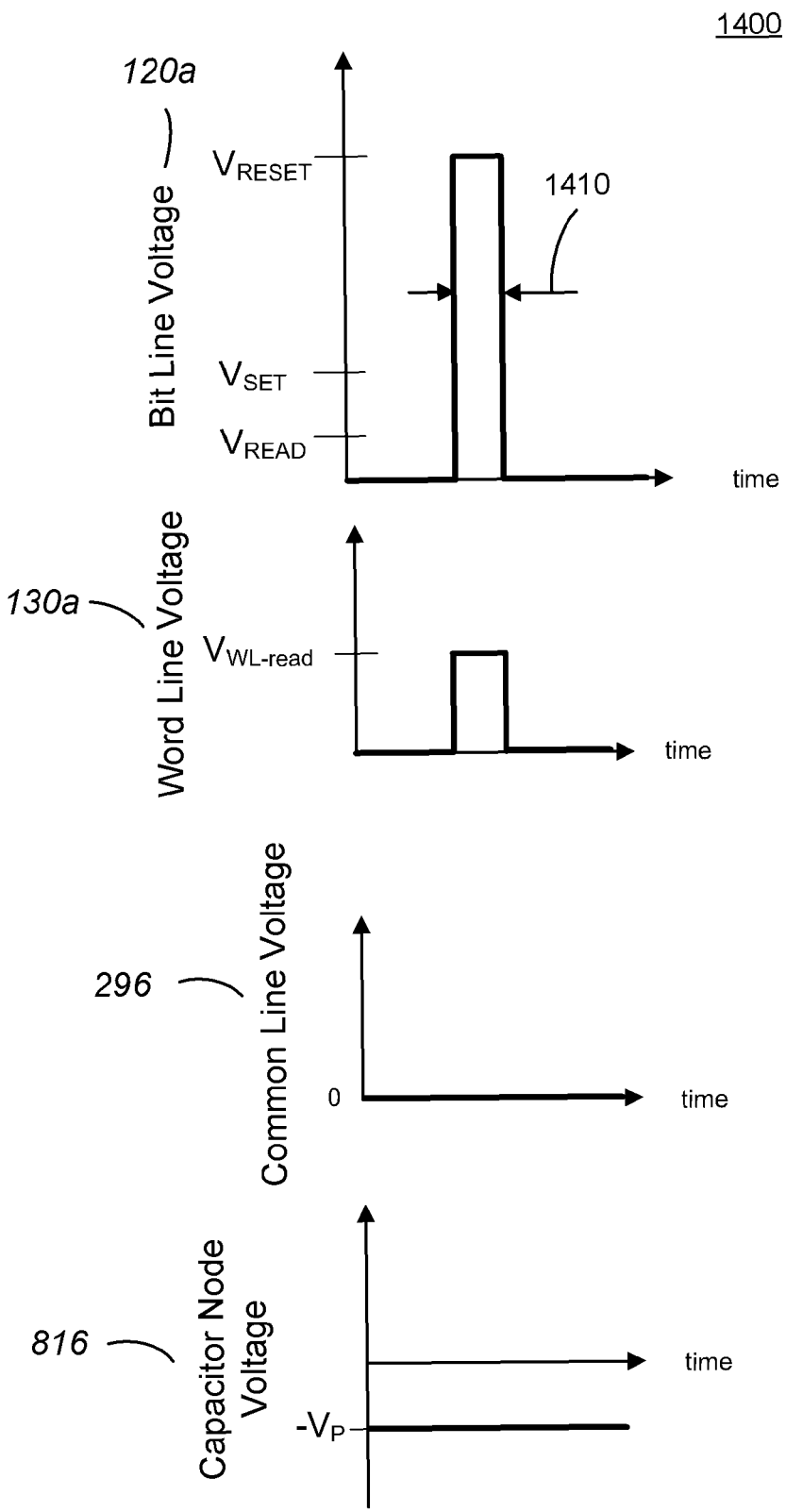
FIG. 14 is a timing diagram of the save bias arrangement of the save operation of FIG. 13.

FIG. 13 is a flow diagram of a save operation 1300 of the memory cell 801, and FIG. 14 is a timing diagram of a save bias arrangement 1400. As will be understood, the timing diagram of FIG. 14 is simplified and not necessarily to scale.

The save operation 1300 begins at step 1310, for example in response to an event such as the beginning of a power down operation of the integrated circuit 110.

At step 1320 a save bias arrangement 1400 is applied to the memory cell 801 to directly store a data value in the memory element 812 in dependence upon the data value stored in capacitor 814. As was mentioned above, during operation of the memory cell 801 using the capacitor 814 as a data storage element the programmable resistance memory element 812 is in the lower resistance set state.

Referring to FIG. 14, the save bias arrangement 1400 comprises applying a voltage $V_{WL\text{-}Read}$ to the word line 130a, applying a reset voltage $V_{RESET}$ having a pulse width 1410 to the bit line 120a, and the common source line 296 is supplied a ground potential. The second node 816 of the capacitor 814 is maintained at a negative voltage $-V_P$.

If the access transistor 810 is in the erased threshold state, the voltage $V_{WL\text{-}Read}$ is sufficient to turn on the access transistor 810 and the voltage $V_{RESET}$ induces a reset current to flow on the bit line 120a and along current path 880 through the memory element 812. The reset current induced by the reset voltage $V_{RESET}$ is sufficient to raise the temperature of an active region of the memory element 812 above the transition temperature of the phase change material and also above the melting temperature to place the active region in a liquid state. The current is then terminated, for example by terminating the voltages on the word line 130a and bit line 120a, resulting in a relatively quick quenching time as the active region cools to stabilize to a high resistance generally amorphous phase, thereby causing a transition in the memory element 812 from the lower resistance set state to the higher resistance reset state.

However, if the access transistor 810 is in the programmed threshold state, the voltage $V_{WL\text{-}Read}$ is insufficient to turn on the access transistor 810 and the memory element 812 remains in the lower resistance set state.

Embodiments of the memory cells described herein include phase change based memory materials, including chalcogenide based materials and other materials, for the programmable resistance memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory cell comprising:
   a transistor in a current path between first and second access lines;
   a programmable resistance memory element in the current path between the first and second access lines;
   a capacitor electrically coupled between a reference node and a node in the current path between the first access line and the programmable resistance memory element; and
   bias circuitry coupled to the memory cell, the bias circuitry operable in a first mode to program and erase data in the programmable resistance memory element by controlling resistance of the programmable resistance memory element between the first and second access lines, and operable in a second mode to program and erase data in the capacitor in response to a voltage on the first access line, during which second mode a resistance state of the programmable resistance memory element remains unchanged.

2. The device of claim 1, further comprising bias circuitry coupled to the memory cell, the bias circuitry operable in a first mode to read data in the programmable resistance memory element, and operable in a second mode to read data in the capacitor.

3. The device of claim 1, wherein the transistor comprises a floating body transistor, and the node of the capacitor in the current path comprises a body region of the floating body transistor, and the transistor has a threshold voltage corresponding to the data stored in the capacitor.

4. The device of claim 1, wherein the bias circuitry is operable in a third mode comprising a bias arrangement applied to the memory cell to directly transfer a data value stored in one of the programmable resistance memory element and the capacitor to the other of the programmable resistance memory element and the capacitor.

5. The device of claim 1, wherein the bias circuitry is operable in a third mode to store a data value in the programmable resistance memory element in dependence upon a data value stored in the capacitor.

6. The device of claim 5, wherein the bias circuitry operable in the third mode comprises changing a resistance state of the programmable resistance memory element in dependence upon an amount of charge stored on the capacitor.

7. The device of claim 6, wherein the charge stored on the capacitor alters a threshold voltage of the transistor.

8. The device of claim 1, wherein the bias circuitry is operable in a third mode to store a data value in the capacitor in dependence upon a data value stored in the programmable resistance memory element.

9. The device of claim 8, wherein the bias circuitry operable in the third mode comprises changing an amount of charge stored on the capacitor in dependence upon a resistance state of the programmable resistance memory element.

10. The device of claim 9, wherein the bias circuitry operable in the third mode comprises inducing a current through the programmable resistance memory element to change the amount of charge stored on the capacitor.

11. The device of claim 1, wherein:
the transistor is a field effect transistor having a channel region comprising semiconductor material on an insulation layer;
the node in the current path comprises the channel region of the field effect transistor; and
the reference node is within a substrate underlying the insulation layer.

12. The device of claim 1, wherein:
the transistor is a field effect transistor having source and drain regions separated by a channel region, the source and drain regions and the channel region within a semiconductor substrate;
the capacitor has a first terminal comprising conductive material within a trench in the substrate and surrounded by an insulation material; and
the capacitor has a second terminal comprising a portion of the semiconductor substrate surrounding the insulation material.

13. A method for operating a memory cell comprising a transistor in a current path between first and second access lines, a programmable resistance memory element in the current path between the first and second access lines, and a capacitor electrically coupled between a reference node and a node in the current path between the first access line and the programmable resistance memory element, the method comprising:
operating the memory cell in a first mode to program and erase data in the programmable resistance memory element by controlling resistance of the programmable resistance memory element between the first and second access lines; and
operating the memory cell in a second mode to program and erase data in the capacitor in response to a voltage on the first access line, during which second mode a resistance state of the programmable resistance memory element remains unchanged.

14. The method of claim 13, wherein the transistor comprises a floating body transistor, and the node of the capacitor in the current path comprises a body region of the floating body transistor, and the transistor has a threshold voltage corresponding to the data value stored in the capacitor.

15. The method of claim 13, further comprising operating the memory cell in a third mode comprising applying a bias arrangement to the memory cell to directly transfer a data value stored in one of the programmable resistance memory element and the capacitor to the other of the programmable resistance memory element and the capacitor.

16. The method of claim 13, further comprising operating the memory cell in a third mode to store a data value in the programmable resistance memory element in dependence upon a data value stored in the capacitor.

17. The method of claim 16, wherein the operating the memory cell in the third mode comprises changing a resistance state of the programmable resistance memory element in dependence upon an amount of charge stored on the capacitor.

18. The method of claim 17, wherein the charge stored on the capacitor alters a threshold voltage of the transistor.

19. The method of claim 13, further comprising operating the memory cell in a third mode to store a data value in the capacitor in dependence upon a data value stored in the programmable resistance memory element.

20. The method of claim 19, wherein the operating the memory cell in the third mode comprises changing an amount of charge stored on the capacitor in dependence upon a resistance state of the programmable resistance memory element.

21. The method of claim 20, wherein the operating the memory cell in the third mode comprises inducing a current through the programmable resistance memory element to change an amount of charge stored on the capacitor.

22. The method of claim 13, wherein:
the transistor is a field effect transistor having a channel region comprising semiconductor material on an insulation layer;
the node in the current path comprises the channel region of the field effect transistor; and
the reference node is within a substrate underlying the insulation layer.

23. The method of claim 13, wherein:
the transistor is a field effect transistor having source and drain regions separated by a channel region, the source and drain regions and the channel region within a semiconductor substrate;
the capacitor has a first terminal comprising conductive material within a trench in the substrate and surrounded by an insulation material; and
the capacitor has a second terminal comprising a portion of the semiconductor substrate surrounding the insulation material.

* * * * *